United States Patent
Nakao

(10) Patent No.: US 7,824,843 B2
(45) Date of Patent: Nov. 2, 2010

(54) PATTERN FORMING METHOD, ELECTRONIC DEVICE MANUFACTURING METHOD AND ELECTRONIC DEVICE

(75) Inventor: Shuji Nakao, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 12/010,780

(22) Filed: Jan. 30, 2008

(65) Prior Publication Data
US 2008/0182082 A1 Jul. 31, 2008

(30) Foreign Application Priority Data
Jan. 31, 2007 (JP) ............................. 2007-021700

(51) Int. Cl.
*G03F 7/26* (2006.01)
(52) U.S. Cl. .................... 430/323; 430/396; 430/394
(58) Field of Classification Search ................ 430/311, 430/326, 322, 315, 314, 5, 312, 394, 323, 430/324, 313
See application file for complete search history.

(56) References Cited

U.S. PATENT DOCUMENTS 6,680,163 B2 * 1/2004 Hwang et al. ............... 430/312
2004/0161677 A1 * 8/2004 Nakao ........................... 430/5
2006/0189122 A1 * 8/2006 Schroeder .................. 438/622

FOREIGN PATENT DOCUMENTS

| JP | 4-146617 | 5/1992 |
|---|---|---|
| JP | 8-255737 | 10/1996 |
| JP | 11-214280 | 8/1999 |
| JP | 2004-193400 | 7/2004 |
| JP | 2004-251969 | 9/2004 |
| JP | 2004-348141 | 12/2004 |
| JP | 2006-156422 | 6/2006 |
| JP | 2006-171118 | 6/2006 |

OTHER PUBLICATIONS

Nakao, S., et al., "Zero MEF Hole Formation with Atten-PSM and Modified Illumination", Proceedings of SPIE Optical Microlithography XVI, 2003, pp. 1258-1269, vol. 5040, SPIE Bellingham Washington USA.

* cited by examiner

*Primary Examiner*—Kathleen Duda
*Assistant Examiner*—Caleen O Sullivan
(74) *Attorney, Agent, or Firm*—McDermott Will & Emery LLP

(57) ABSTRACT

On a film as an object of processing, a first positive photo-resist having a dense hole pattern is formed. On the first positive photo-resist, a second positive photo-resist is formed to fill each of the plurality of holes of the pattern. To the second photo-resist, an image of dark points as a bright-dark inverted image of a high-transmittance half-tone phase shift mask is projected and exposed. By the development of second photo-resist, a pattern of dots of the second photo-resist formed at portions of the dark point image are left in any of the plurality of holes of the pattern. The film as the object of processing is patterned, using the first and second photo-resists as a mask.

11 Claims, 32 Drawing Sheets

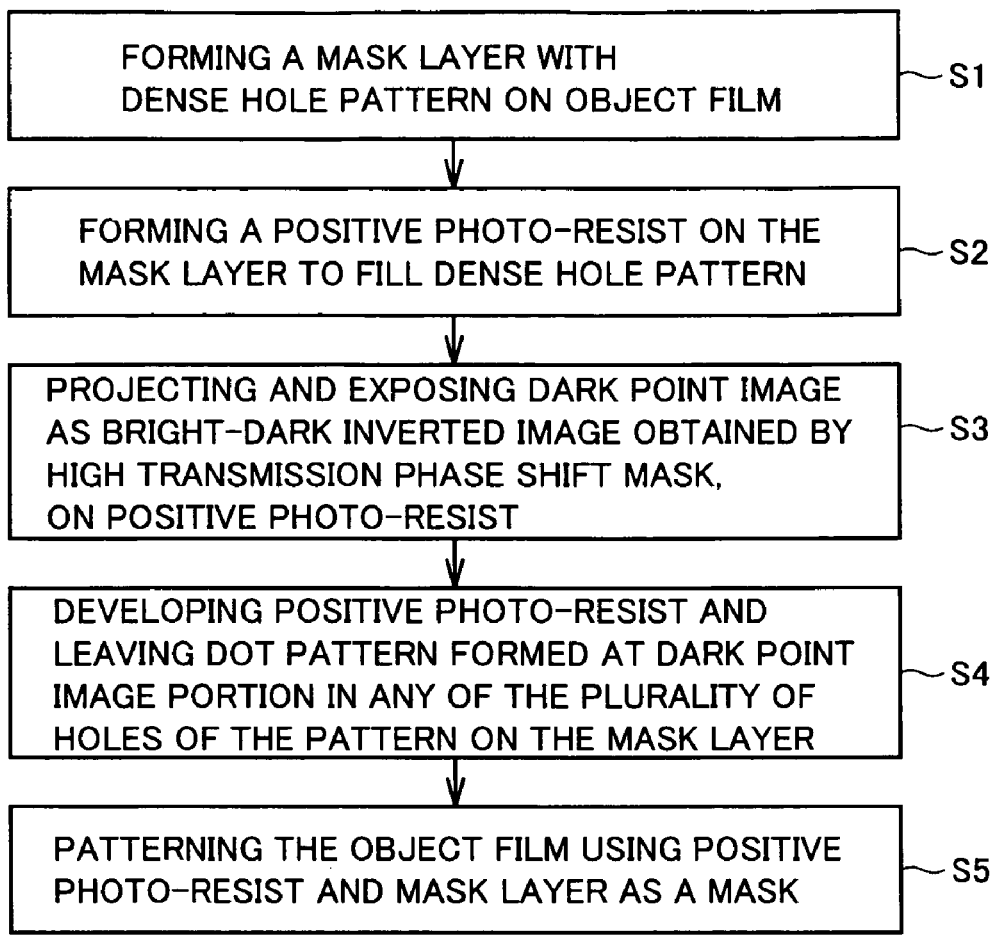
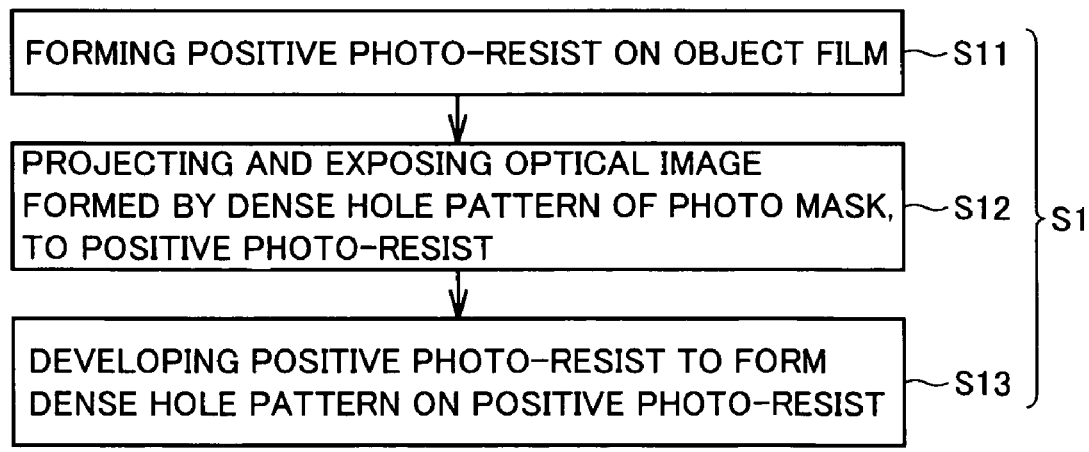

CROSS-POLE ILLUMINATION

QUADRUPOLE ILLUMINATION

PATTERN FORMING METHOD, ELECTRONIC DEVICE MANUFACTURING METHOD AND ELECTRONIC DEVICE

BACKGROUND OF THE INVENTION

1. Field of the Invention

The present invention relates to a pattern forming method, an electronic device manufacturing method and to an electronic device. More specifically, the present invention relates to a method of forming a randomly arranged hole pattern having minute, isolated hole pattern, a method of manufacturing an electronic device and to the electronic device.

2. Description of the Background Art

Formation of a hole pattern by photolithography requires, different from a line pattern, local presence of electromagnetic field when viewed two dimensionally. Therefore, miniaturization is difficult in principle. Further, when a pattern of holes is formed by a positive photo-resist, effective image contrast inherently becomes smaller.

Particularly, formation of a minute, isolated hole with high process margin is difficult, as effective super-resolution technique has not been known. Therefore, formation of a minute, isolated hole remains one factor hindering device miniaturization.

Because of the above-described limitation in principle, an optical image formed by a pattern of regularly arranged holes has image quality inferior to that of a pattern of dense lines that is a one-dimensional pattern. For such a hole pattern, however, super-resolution technique represented by modified illumination method is available. Therefore, by applying a high-resolution photo-resist having superior separation performance, minute holes of high density can be formed with high process margin.

In contrast, when a dark point image is formed, excellent image quality of a pattern of random arrangement can be attained by applying a phase-cancellation image using a phase shift mask under optimally modified illumination, as disclosed by the inventors of the present invention (see References 1 and 2 below).

Reference 1: Japanese Patent Laying-Open No. 2004-251969

Reference 2: S. Nakao et al., "Zero MEF Hole Formation with Atten-PSM and Modified Illumination", Proc. of SPIE Vol. 5040 (2003), pp. 1258-1269

Conventional formation of a pattern of randomly arranged holes by applying a phase-inverted image using the phase shift mask requires a negative photo-resist, as described above. For the state-of-the-art ArF excimer laser exposure, however, there is no negative photo-resist of excellent performance. Therefore, it has been difficult by the conventional method to realize characteristics sufficient for practical use with the wavelength of ArF excimer laser.

SUMMARY OF THE INVENTION

The present invention was made in view of the foregoing and its object is to provide a pattern forming method, allowing formation of a pattern of randomly arranged holes with high margin while applying a positive photo-resist, an electronic device manufacturing method and the electronic device.

The pattern forming method in accordance with an embodiment of the present invention includes the following steps.

First, on a film as the object of processing, a mask layer having a pattern of dense holes with a plurality of densely positioned holes is formed by pattern formation applying a first positive photo-resist. On the mask layer, a second positive photo-resist is formed to fill each of the plurality of holes of the dense hole pattern. To the second positive photo-resist, an image of dark points is projected and exposed, using a half-tone phase shift mask. By developing the exposed second positive photo-resist, a pattern of dots formed on the portions corresponding to dark points of the image of the second positive photo-resist is left in any of the plurality of holes of the pattern of the mask layer. Using the dot pattern (resist plug) formed by the mask layer and the second positive photo-resist as a mask, the film as the object of processing is patterned. The half-tone phase shift mask has a half-tone phase shift film having openings for generating dark point image for the dot pattern. The step of projecting and exposing the dark point image using the half-tone phase shift mask on the second positive photo-resist includes the step of exposing with such an amount of exposure that the second positive photo-resist is dissolved at the time of development with the intensity of exposure light transmitted through the half-tone phase shift mask in a region free of any opening, while the second positive photo-resist is not dissolved at the time of development with the intensity of light at the dark point image formed by the openings at the dot pattern portions.

According to the embodiment of the present invention, a pattern of dense holes is formed in the mask layer, which may be realized by using a positive photo-resist. Further, a pattern of randomly arranged dots in two-dimensional view may be formed by using the positive photo-resist. Therefore, by forming the dense hole pattern in the mask layer and thereafter filling any of the dense holes of the pattern with the dots of the pattern, a pattern of holes randomly arranged when viewed two-dimensionally can be formed using a positive photo-resist. Therefore, it becomes possible to form, with high margin, a pattern of randomly arranged holes by applying a positive photo-resist.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a flowchart representing a method of forming a pattern common to Embodiments 1 to 4 of the present invention.

FIG. 2 is a flowchart specifically showing step S1 of FIG. 1, when the mask layer is a positive photo-resist.

DESCRIPTION OF THE PREFERRED EMBODIMENTS

In the following, embodiments of the present invention will be described with reference to the figures.

Embodiment 1

Referring to FIG. 1, in the pattern forming method of the present embodiment, first, on a film as the object of processing, a mask layer having a pattern of dense holes is formed (step S1). To fill the pattern of dense holes, a positive photo-resist is formed on the mask layer (step S2). To the positive photo-resist, an image of dark points as a bright-dark inverted image provided by a high-transmittance half-tone (HT) phase shift mask is projected and exposed (step S3). Structure of the high-transmittance half-tone phase shift mask capable of forming the image of dark points as the bright-dark inverted image will be described later. The exposed positive photo-resist is developed. Thus, the positive photo-resist is removed at portions other than the dot pattern formed in the dark point image portion. Further, the positive photo-resist at the dot pattern portion is left inside any of the plurality of holes forming the dense pattern, to serve as a resist plug (step S4). Using the positive photo-resist and the mask layer as a mask, the film as the object of processing is selectively removed and patterned (step S5). In this manner, a pattern of holes arranged at random when viewed two-dimensionally is formed on the film.

Next, an example in which the mask layer is a positive photo-resist will be described specifically.

Figure 3:
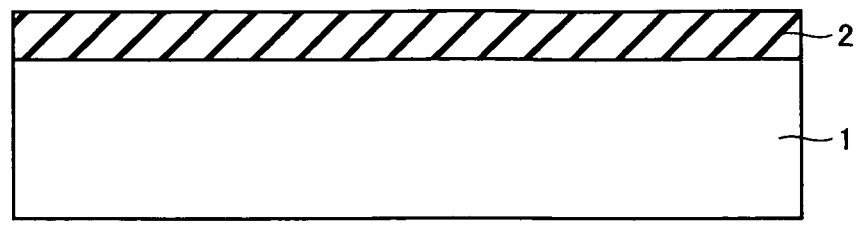
FIGS. 3 to 11 are schematic cross-sectional views showing, in order, steps of the pattern forming method in accordance with Embodiment 1.

Referring to FIG. 3, first, a film 2 as the object of processing is formed on a substrate (such as a wafer) 1.

Figure 4:
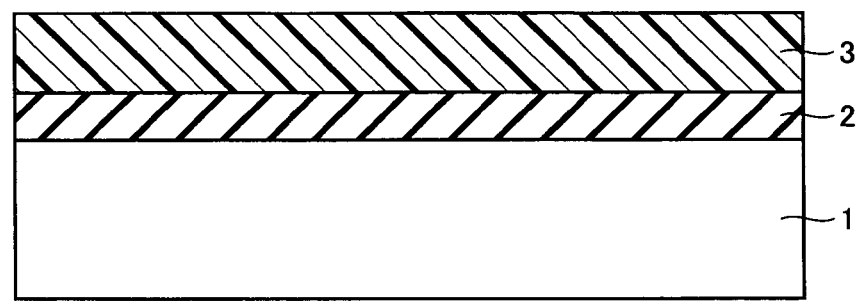

Referring to FIG. 4, on the film 2 as the object of processing, a first positive photo-resist 3 is applied and formed (step S11: FIG. 2). At this time, though not shown, a bottom anti-reflection coating (BARC) and a top anti-reflection coating (TARC) are formed as upper and lower layers of the first positive photo-resist 3, as needed.

Figure 5:
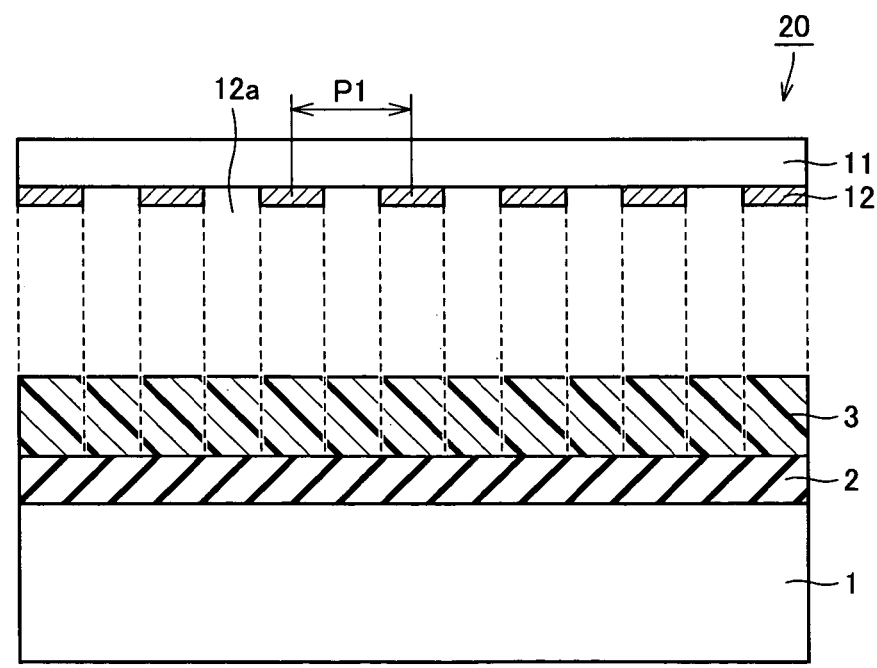

Referring to FIG. 5, the first exposure process is performed. An optical image of a half-tone phase shift mask 20 having a pattern of dense holes formed therein is projected to the first positive photo-resist 3 by a projection optical system, using quadrupole illumination, whereby the first positive photo-resist 3 is exposed (step S12: FIG. 2). In the present embodiment, an immersion lithography system having the exposure wavelength ($\lambda$) of, for example, 193 nm, and numerical aperture (NA) of, for example, 1.07 is used.

Half-tone phase shift mask 20 has a transparent substrate 11 and a half-tone phase shift film 12. Transparent substrate 11 is formed of a material transparent to exposure light, so that the exposure light is passed therethrough. Half-tone phase shift film 12 is formed on transparent substrate 11 and has a plurality of openings 12a exposing portions of the surface of transparent substrate. Half-tone phase shift film 12 is formed such that the exposure light transmitted through half-tone phase shift film 12 comes to have the phase different from that of the exposure light transmitted through the opening 12a (for example, phase different by 180°). Further, optical intensity of the exposure light transmitted through half-tone phase shift film 12 relative to the optical intensity of light transmitted through the opening, which is large as compared with the wavelength, that is, transmittance of half-tone phase shift film 12, may be set appropriately, for example, to 20%.

Figure 12:
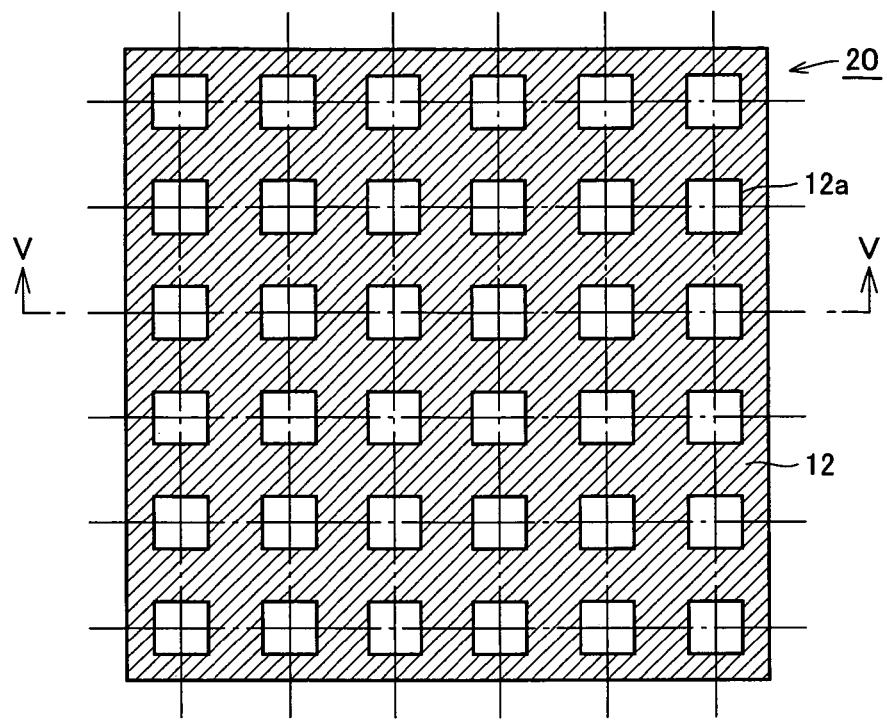
FIG. 12 is a plan view showing a shape of a pattern formed on the half-tone phase shift mask of the photo mask used in the first exposure process.

Assume an orthogonal lattice (for example, square lattice) having a plurality of longitudinal lines and a plurality of lateral lines intersecting with each other when viewed two-dimensionally, such as shown in FIG. 12. The plurality of openings 12a are arranged regularly at each of the plurality of intersections of the plurality of longitudinal lines and the plurality of lateral lines, thereby forming the pattern of dense holes.

Figure 6:
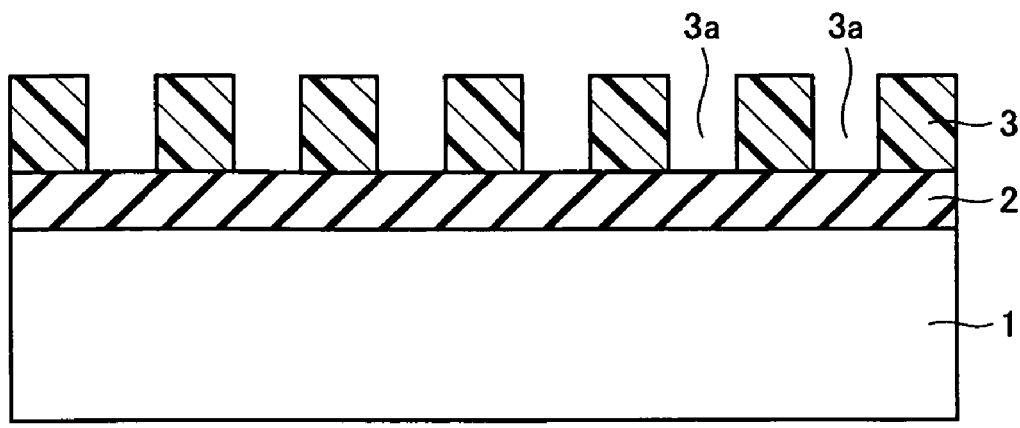

Referring to FIG. 6, the first positive photo-resist 3 having the optical image of a pattern of dense holes exposed as described above is developed. Consequently, a pattern of a plurality of holes 3a is formed in the first photo-resist 3. Each of the plurality of holes 3a of the pattern is arranged regularly, by way of example, with the arrangement pitch of 160 nm and the diameter of 60 nm, whereby a pattern of dense holes is formed (step S13: FIG. 2). Though not shown here, when the BARC and TARC films mentioned above are applied, BARC film remains as it is after development. The remaining BARC film also serves as a BARC film in the second exposure process described later. The TARC film is dissolved at the time of development of first photo-resist 3 or by a process prior to development.

Thereafter, a hardening process is performed in which the first photo-resist 3 is solidified by volatilizing remaining solvent from the first photo-resist 3. The hardening process is performed to avoid mixture of another, second photo-resist 4 applied and formed on the first photo-resist 3 in the second exposure process with the first photo-resist 3, which mixture hinders formation of a uniform film. Generally, the hardening process is realized by irradiating the first photo-resist 3 with ultraviolet ray, irradiation with an electron beam, or injection of rare gas ions. In the present embodiment, the hardening process is performed, for example, by irradiating ultraviolet ray.

Figure 7:
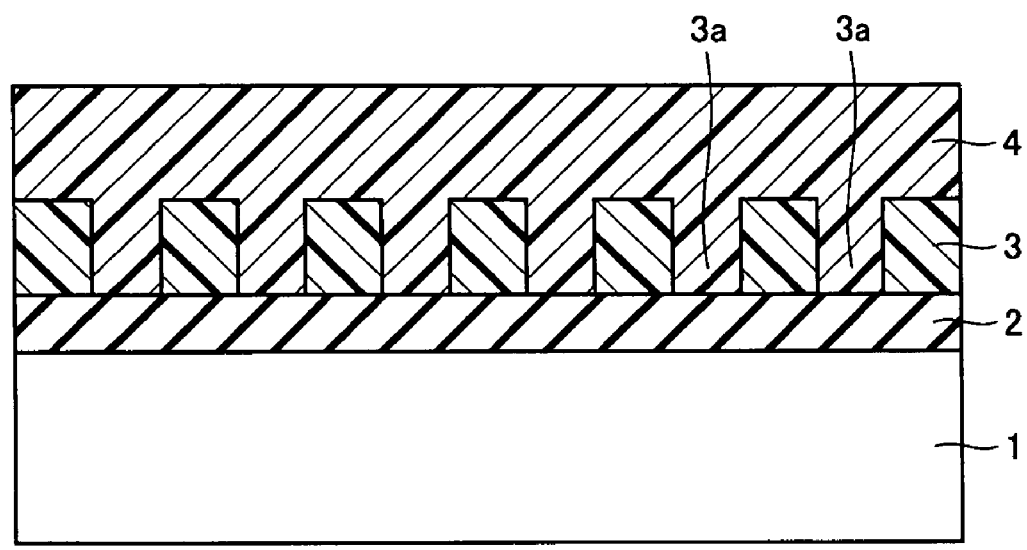

Referring to FIG. 7, on the first photo-resist 3 after hardening process, another, second positive photo-resist 4 is applied and formed to fill each of the plurality of holes 3a of the pattern (step S2: FIG. 1). At this time, though not shown, a bottom anti-reflection coating (BARC) and a top anti-reflection coating (TARC) are formed as upper and lower layers of the second positive photo-resist 4 as needed. In the present embodiment, the BARC film formed as the lower layer of first photo-resist 3 is left as it is and, therefore, BARC film is not formed in this step of forming the second photo-resist 4. The TARC film is necessary for precise pattern formation and, therefore, it is formed as an upper layer of the second photo-resist 4.

Figure 8:
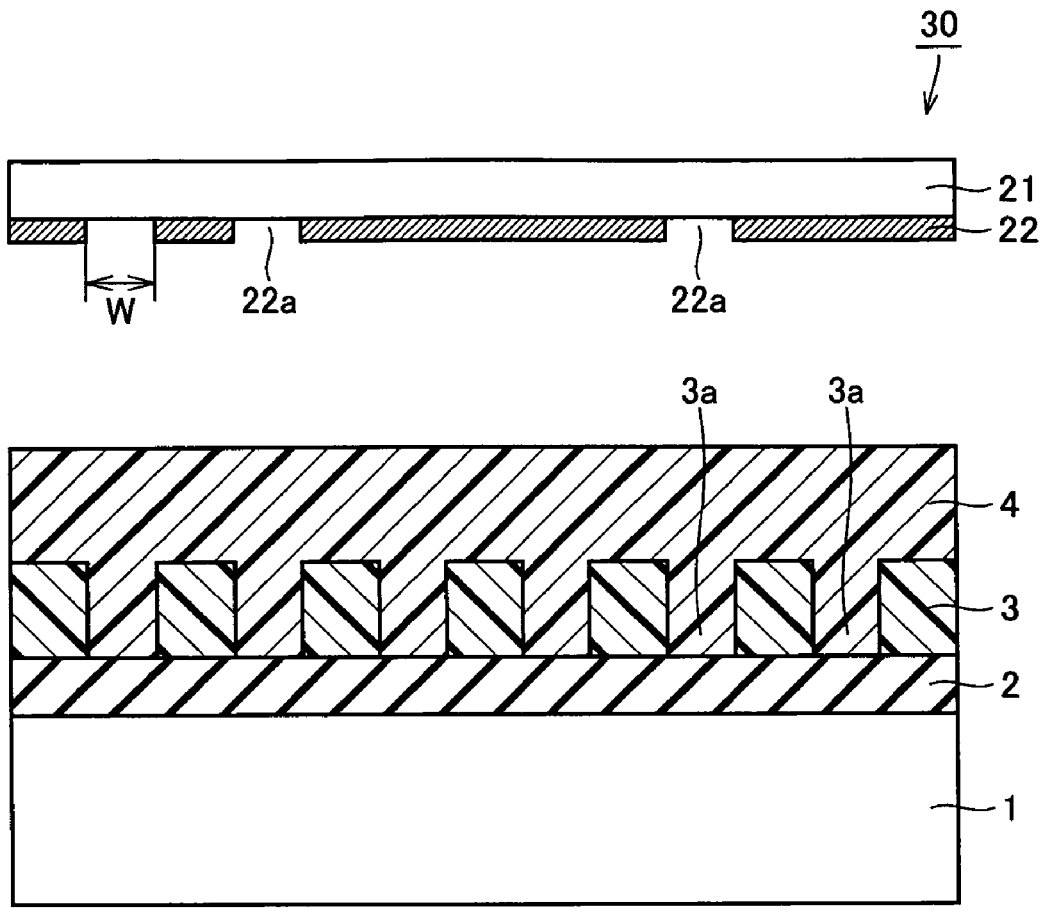

Referring to FIG. 8, the second exposure process is performed. An optical image of a high-transmittance half-tone phase shift mask 30 having a pattern of randomly arranged holes formed therein is projected to the second positive photo-resist 4 by a projection optical system using a cross-pole illumination, and the second photo-resist 4 is exposed (step S3: FIG. 1). In the present embodiment, immersion lithography system having the exposure wavelength ($\lambda$) of, for example, 193 nm, and numerical aperture (NA) of, for example, 1.07 is used.

High-transmittance half-tone phase shift mask 30 has a transparent substrate 21 and a half-tone phase shift film 22. Transparent substrate 21 is formed of a material transparent to exposure light, so that the exposure light is passed therethrough. Half-tone phase shift film 22 is formed on transparent substrate 21 and has one or a plurality of openings 22a exposing a portion or portions of the surface of transparent substrate 21. Half-tone phase shift film 22 is formed such that the exposure light transmitted through half-tone phase shift film 22 comes to have the phase different from that of the exposure light transmitted through the opening 22a (for example, phase different by 180°). Further, optical intensity of the exposure light transmitted through half-tone phase shift film 12 relative to the optical intensity of light transmitted through the opening, which is sufficiently large as compared with the wavelength, is at least 15% and at most 25%. Dimension W of the opening 22a is at least 0.26 and at most 0.45 with the wavelength $\lambda$/numerical aperture NA=1, and preferably, it is at least 0.32 and at most 0.39.

Here, the dimension W of opening 22a means, if the opening 22a has a square shape when viewed two-dimensionally, the dimension of one side of the square.

Figure 13:
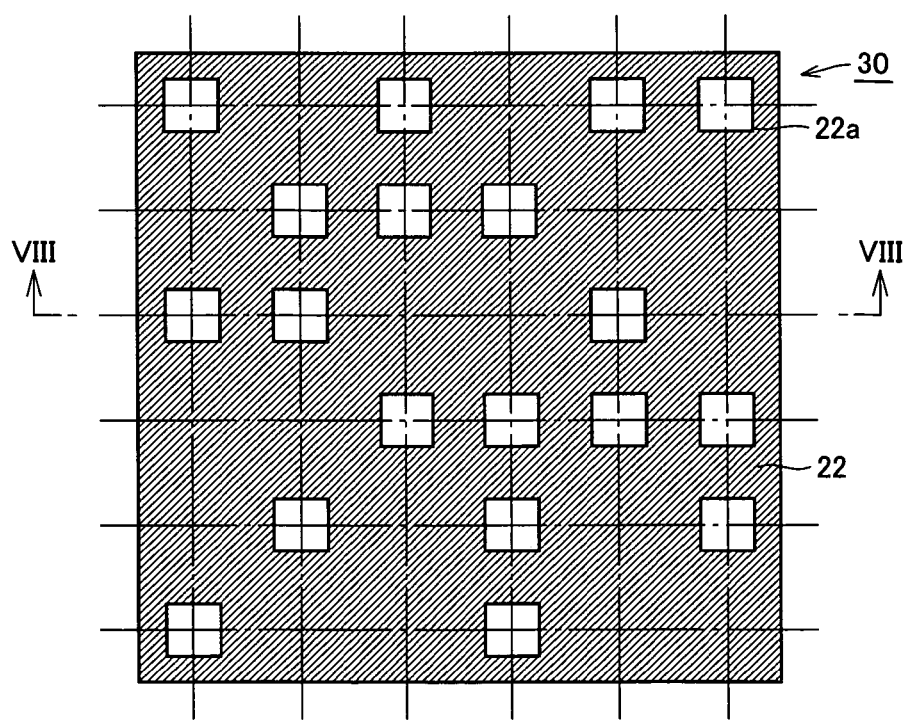
FIG. 13 is a plan view showing a shape of a pattern formed on the half-tone phase shift mask of the photo mask used in the second exposure process.

Assume an orthogonal lattice (for example, square lattice) having a plurality of longitudinal lines and a plurality of lateral lines intersecting with each other when viewed two-dimensionally, as shown in FIG. 13. The one or a plurality of openings 22a are arranged at random at any of the intersections of the plurality of longitudinal lines and lateral lines, thereby forming a pattern of holes arranged at random. Further, the virtual lattice of FIG. 13 corresponds to the virtual lattice of FIG. 12. Therefore, the positions of openings 22a of FIG. 13 coincide with positions of any of the plurality of holes 12a of the pattern shown in FIG. 12.

By the exposure using high-transmittance half-tone phase shift mask 30, a dark point image as the bright-dark inverted image of openings 22a of half-tone shift phase shift film 22 is projected to the second photo-resist 4. Specifically, in a common half-tone phase shift mask, a region where an opening is formed becomes the bright portion while the region where the half-tone phase shift film is formed becomes the dark portion. In contrast, in the high-transmittance half-tone phase shift mask 30, the region where opening 22a is formed becomes the dark portion and the region where high-transmittance half-tone phase shift film 22 is formed becomes the bright portion.

Therefore, by appropriately setting the amount of exposure, the optical intensity of the dark point image formed by opening 22a can be set not to dissolve the second positive photo-resist 4 at the time of development. Further, optical intensity of exposure light transmitted through the region where high-transmittance half-tone phase shift film 22 relatively larger than the wavelength is formed comes to be sufficient to dissolve the second positive photo-resist 4 at the time of development.

Figure 9:
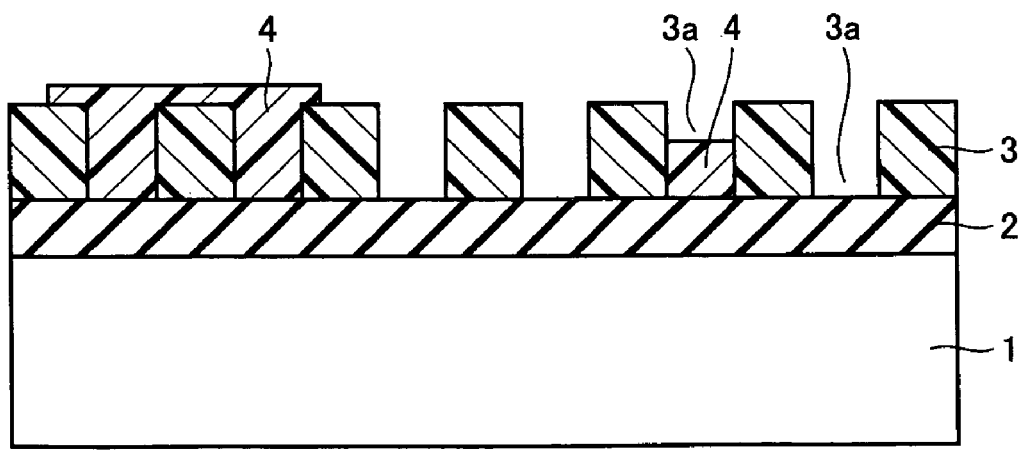

Referring to FIG. 9, the second positive photo-resist 4 having the image of dark points arranged at random exposed as described above is developed, whereby the resist at portions of the dark points is left as a pattern of dots. As a result, the portion corresponding to the dots of the pattern of the second photo-resist 4 fill the inside of any of the plurality of holes 3a of the pattern of the first photo-resist 3. As the dot pattern 4 fills hole pattern 3a, a pattern of holes arranged at random when viewed two-dimensionally can be obtained.

Figure 10:
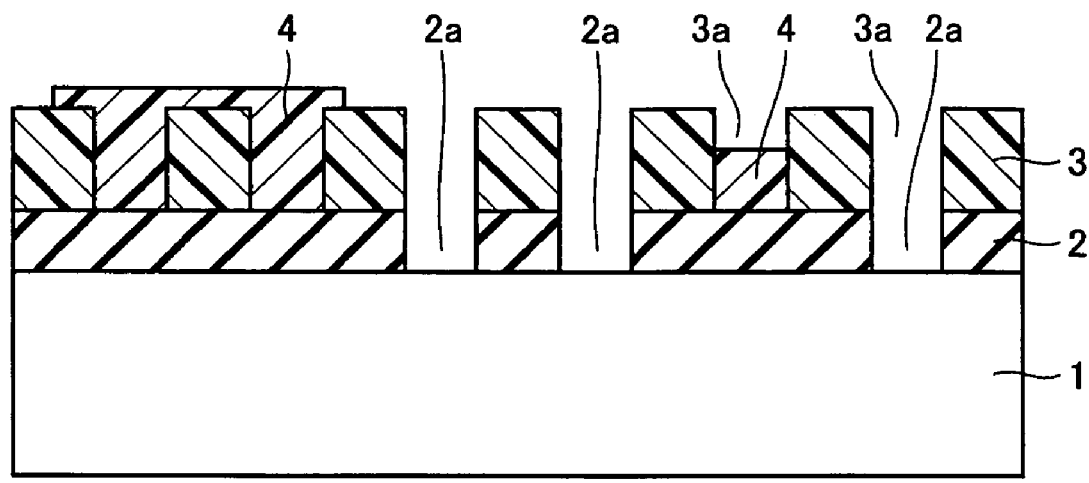

Referring to FIG. 10, using photo-resists 3 and 4 as a mask, film 2 to be processed is selectively removed by etching. Thereafter, photo-resists 3 and 4 are removed, for example, by ashing.

Figure 11:
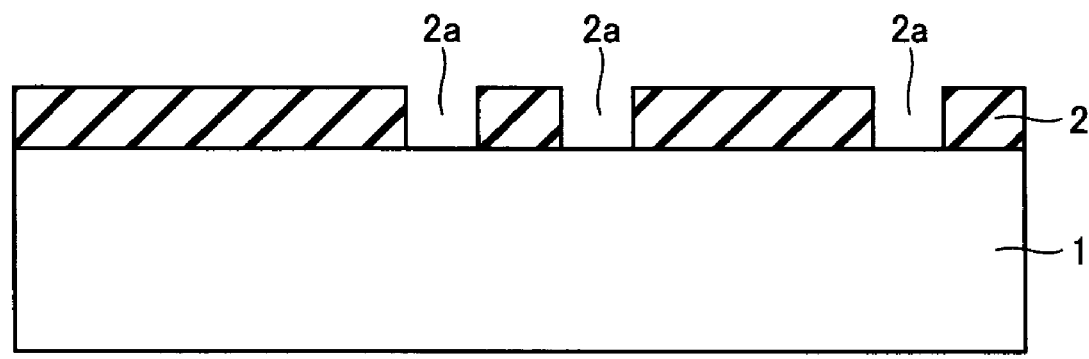

Referring to FIG. 11, by the etching, a pattern of holes 2a arranged at random when viewed two-dimensionally is formed on the film 2 as the object of processing, and the pattern in accordance with the present embodiment is formed. The pattern formed in this manner may be applicable to an electronic device.

Next, the projection aligner used in the first and second exposure processes of the pattern forming method above will be described.

Figure 14:
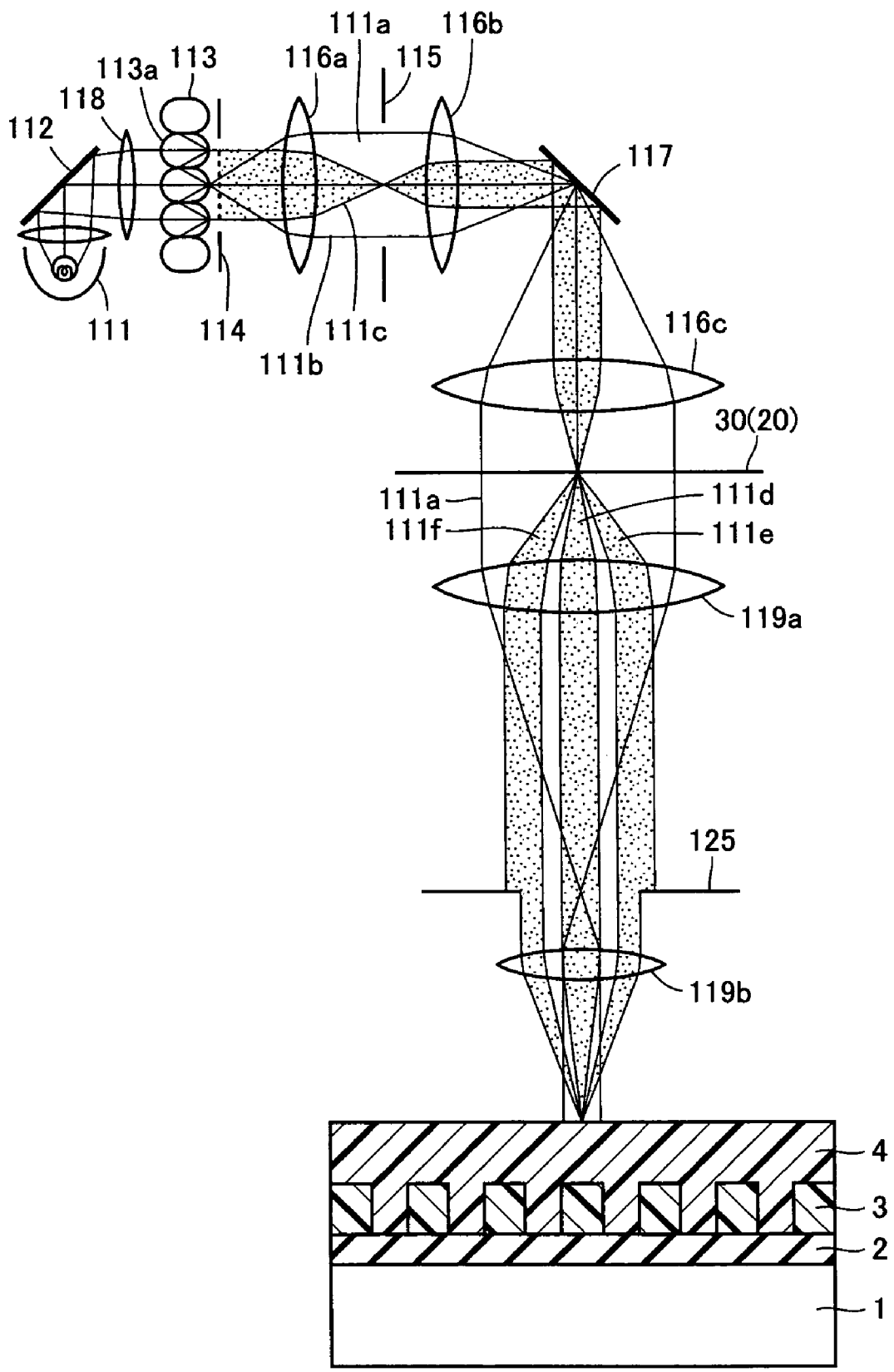
FIG. 14 schematically shows an arrangement of a projection aligner used in the first and second exposure processes in the pattern forming method in accordance with Embodiment 1 of the present invention, particularly illustrating the second exposure process.

Referring to FIG. 14, the projection aligner is to project a pattern on photo mask 30 (or 20) to the second photo-resist 4 on substrate 1. The projection aligner has an illumination optical system from a light source 111 to the pattern of photo mask 30 (or 20) and a projection optical system from the pattern of photo mask 30 (or 20) to substrate 1.

The illumination optical system includes a light source 111, a reflecting mirror 112, a collective lens 118, a fly-eye lens 113, a diaphragm 114 for modified illumination, collective lenses 116a, 116b, 116c, a blind diaphragm 115, and a reflecting mirror 117. The projection optical system includes projector lenses 119a, 119b and a pupil plane diaphragm 125.

In the exposure operation, first, a light beam 111a emitted from light source 111 is reflected by reflecting mirror 112. Then, light beam 111a passes through collective lens 118 and enters each of fly-eye component lenses 113a of fly-eye lens 113 and, then, passes through diaphragm 114.

Here, light beam 111b represents an optical path formed by one fly-eye component lens 113a, and light beam 111c represents an optical path formed by fly-eye lens 113. Light beam 111a that has passed through diaphragm 114 passes through collective lens 116a, blind diaphragm 115 and collective lens 116b, and reflected at a prescribed angle by reflecting lens 117.

Light beam 111a reflected by reflecting lens 117 passes through collective lens 116c, and uniformly irradiates an entire surface of photo mask 30 (or 20) having a prescribed pattern formed thereon. Thereafter, light beam 111a is reduced to a prescribed magnification by projector lenses 119a and 119b, and exposes the second photo-resist 4 on substrate 1.

Figure 15:
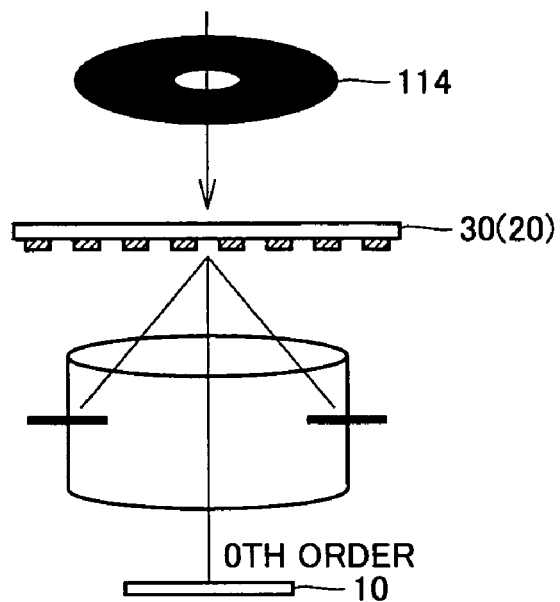
FIG. 15 illustrates normal illumination.

In the present embodiment, phase shift mask 30 (or 20) is irradiated not by normal illumination but modified illumination both in the first and second exposure processes. By normal illumination, the exposure light irradiates phase shift mask 30 (or 20) vertically as shown in FIG. 15 and, by the flux of three light beams of 0-th and ±1-st order, photo-resist of wafer 10 is exposed. When the pattern of phase shift mask 30 (or 20) becomes smaller, diffraction angle increases and, with vertical illumination, entrance of light beams of ±1-st order to the lens becomes difficult, possibly resulting in resolution failure.

Figure 16:
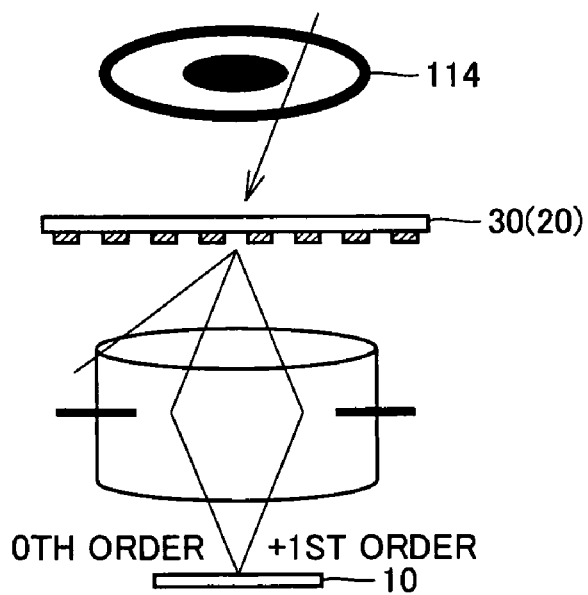
FIG. 16 illustrates modified illumination.

Therefore, modified illumination is used, so that the illuminating light beam flux enters obliquely to phase shift mask 30 (or 20), as shown in FIG. 16. Thus, exposures becomes possible only with the flux of two light beams of 0 and +1-st or −1-st order diffracted by phase shift mask 30 (or 20), attaining resolution.

Figure 17:
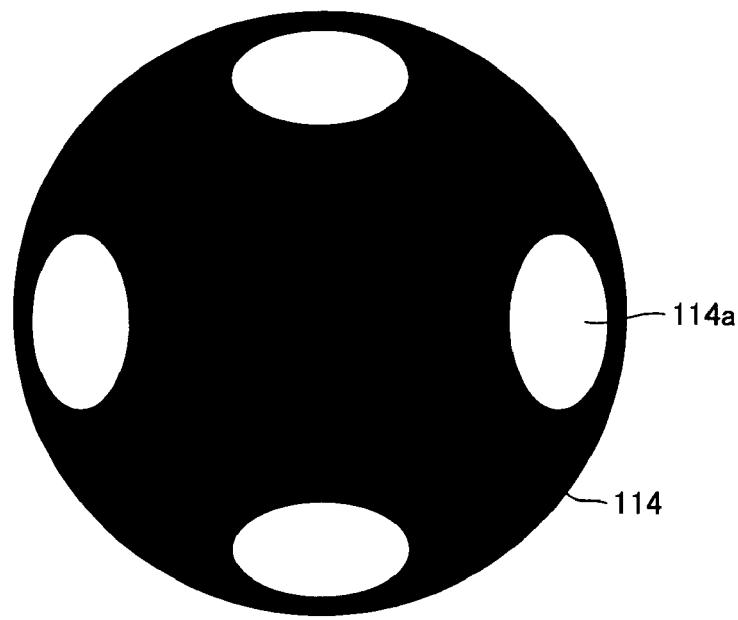
FIG. 17 is a plan view showing an example of illumination diaphragm used for cross-pole illumination.
Figure 18:
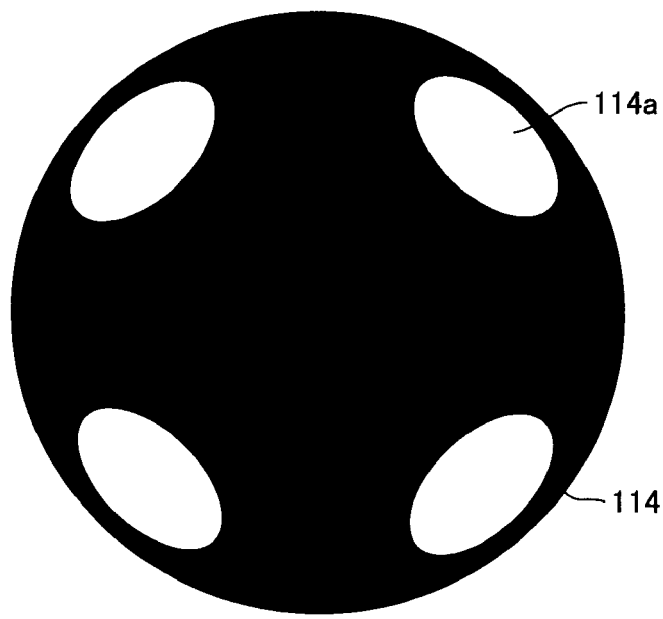
FIG. 18 is a plan view showing an example of illumination diaphragm used for quadrupole illumination.

As the modified illumination in the second exposure process of the present embodiment, cross-pole illumination is used. Specifically, a cross-pole illumination diaphragm 114 having four transmitting portions 114a such as shown in FIG. 17 is used as diaphragm 114 of FIG. 14. Further, as the modified illumination for the first exposure process of the present embodiment, quadrupole illumination is used. Specifically, a quadrupole diaphragm 114 having four transmitting portions 114a and having the shape of cross-pole illumination rotated by 45° as shown in FIG. 18 is used as diaphragm 114 of FIG. 14.

Next, the structure of an electronic device having a pattern obtained by the pattern forming method in accordance with the present embodiment will be described.

Figure 19:
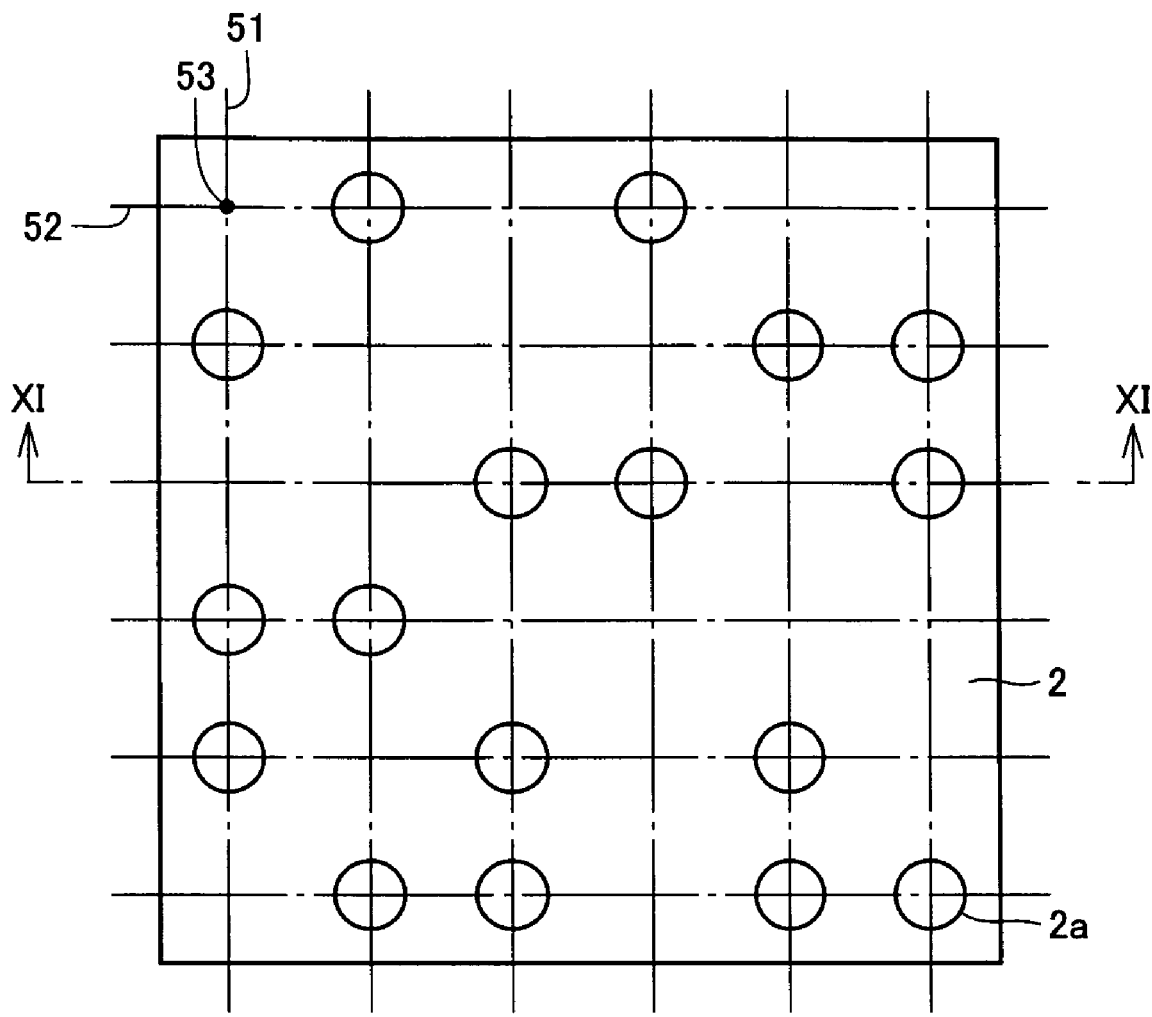
FIG. 19 is a plan view schematically showing a structure of an electronic device in accordance with Embodiment 1 of the present invention.

The cross-sectional view of FIG. 11 corresponds to the cross-section taken along the line XI-XI of FIG. 19. Referring to FIGS. 11 and 19, an electronic device in accordance with the present embodiment has substrate 1 and film 2 as the object of processing formed on substrate 1. In film 2 as the object of processing, a pattern of a plurality of holes 2a arranged at random when viewed two-dimensionally is formed. The plurality of holes 2a of the pattern are arranged at arbitrary intersections 53 among a plurality of intersections 53 where a plurality of longitudinal lines 51 and a plurality of lateral lines 52 intersect, when we assume an orthogonal lattice (for example, square lattice) having the plurality of longitudinal lines 51 and the plurality of lateral lines 52 intersecting with each other when viewed two-dimensionally. Two-dimensional dimension (diameter) of the hole 2a of the pattern is, by way of example, 60 to 70 nm.

Next, how a bright-dark inverted image of the pattern is obtained by using high-transmission half-tone phase shift mask 30 shown in FIG. 8 will be described. In the description here, the exposure wavelength of 248 nm is used, different from the wavelength of 193 nm used in the embodiment. The physical phenomenon, however, is independent of the wavelength and, therefore, it is noted that the same phenomenon occurs with the wavelength of 193 nm.

Referring to FIGS. 20 to 23, the parameter used in each graph is focus. Optical conditions are as follows: exposure light wavelength is 248 nm, numerical aperture NA is 0.80, and illumination is cross-pole illumination ($\sigma_{in}/\sigma_{out}=0.70/0.85$). The shape of diaphragm 14 of the cross-pole illumination is as shown in FIG. 17, with four light transmitting portions 114a. Further, transmittance of phase shift mask 30 (I2/I1) is 20%.

Figure 20:
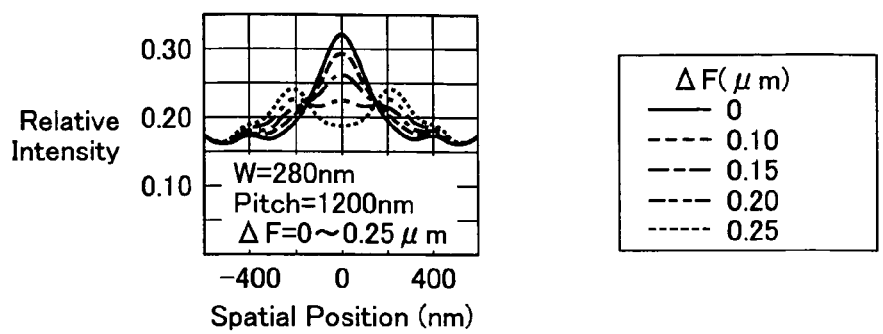
FIG. 20 shows intensity of an optical image formed by an image forming system when an opening of a high-transmission half-tone phase shift mask shown in FIG. 8 is provided as an isolated pattern having the dimension of W=280 nm.

When the dimension W of opening 22a of high-transmittance half-tone phase shift mask 30 is large, pattern formation is almost the same as that by a conventional half-tone phase shift mask. In that case, intensity of light transmitted through opening 22a is sufficiently higher than the intensity of light transmitted through half-tone phase shift film 22 in a phase relation of canceling, as shown in FIG. 20. Therefore, at a region corresponding to opening 22a, a portion brighter than other regions (portion of high optical intensity) is formed.

Figure 21:
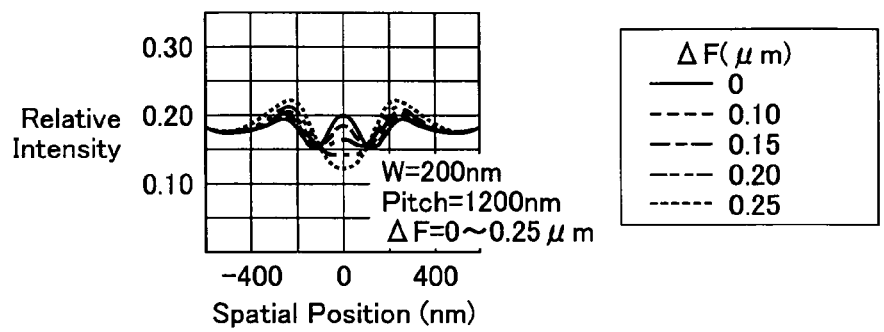
FIG. 21 shows intensity of an optical image formed by an image forming system when an opening of a high-transmission half-tone phase shift mask shown in FIG. 8 is provided as an isolated pattern having the dimension of W=200 nm.

When the dimension W of opening 22a is made smaller, intensity of light transmitted through opening 22a becomes lower as shown in FIG. 21, and cancellation by the light transmitted through half-tone phase shift film 22 becomes relatively larger. As a result, an image having approximately the same intensity as that of light transmitted through half-tone phase shift film 22 is formed. In that case, the image contrast is low and it becomes difficult to form a pattern in the photo-resist.

Figure 22:
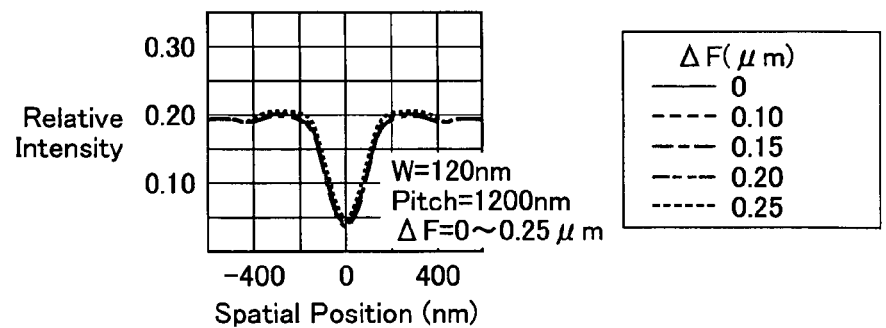
FIG. 22 shows intensity of an optical image formed by an image forming system when an opening of a high-transmission half-tone phase shift mask shown in FIG. 8 is provided as an isolated pattern having the dimension of W=120 nm.

When the dimension W of opening 22a is further made smaller, intensity of light transmitted through opening 22a becomes approximately the same as the intensity of light transmitted through half-tone phase shift film 22. Here, the phases have the relation opposite to each other (that is, the phases are different by 180° from each other) and, therefore, at the region corresponding to the opening 22a, a dark point image sufficiently darker than other regions is formed, as shown in FIG. 22. Specifically, a bright-dark inverted image of the pattern of half-tone phase shift film 22 is obtained. When this image is applied to a positive photo-resist, a dot pattern can be formed in the photo-resist.

Figure 23:
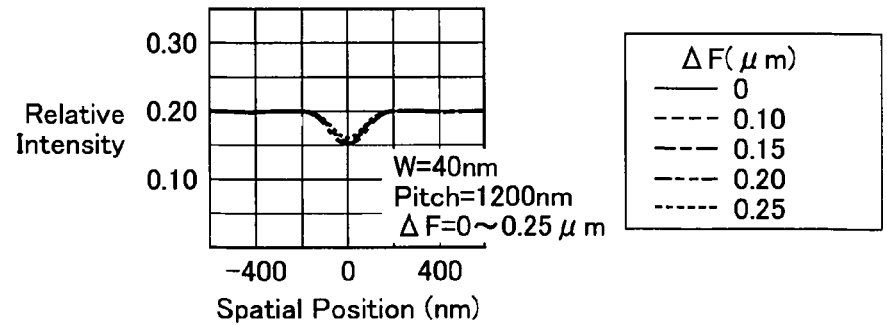
FIG. 23 shows intensity of an optical image formed by an image forming system when an opening of a high-transmission half-tone phase shift mask shown in FIG. 8 is provided as an isolated pattern having the dimension of W=40 nm.

When the dimension W of opening 22a is further made smaller, intensity of light transmitted through opening 22a becomes smaller than the intensity of light transmitted through half-tone phase shift film 22 and the cancellation effect becomes smaller, as shown in FIG. 23. As a result, the dark point becomes less dark (brighter).

When the dimension W of opening 22a is further made smaller, opening 22a would be substantially non-existent, and the image contrast is lost.

It can be seen that, under the optical conditions described above, the bright-dark inverted image such as shown in FIG. 22 is obtained and the dark point image of the bright-dark inverted image has superior focusing characteristic. Further, in order to obtain such a bright-dark inverted image, it is necessary that light transmittance defined as the ratio of intensity of exposure light transmitted through half-tone phase shift film 22 with respect to the intensity of exposure light transmitted through opening 22a is at least 15% and at most 25%. Further, the dimension W of opening 22a must be at least 0.26 and at most 0.45 and preferably at least 0.32 and at most 0.39, when measured with the exposure light wavelength λ/numerical aperture NA being 1. Such relation is described in Japanese Patent Laying-Open No. 2004-251969.

Next, result of inspection of optical images in the first and second exposure processes will be described.

Figure 24:
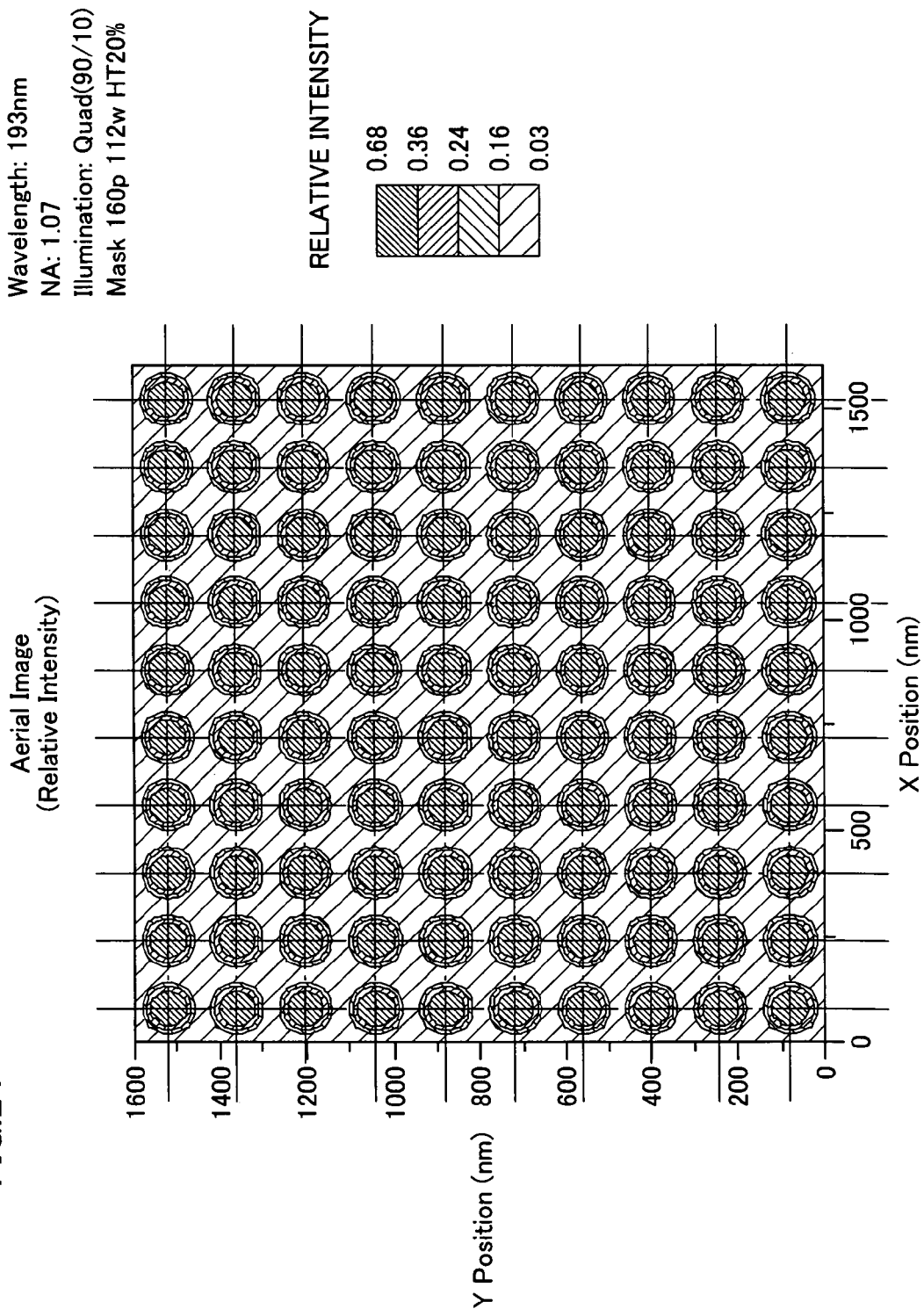
FIG. 24 is a contour line map representing intensity distribution of an optical image of a pattern of 112 nm×112 nm holes arranged densely in two-dimension with a pitch of 160 nm, formed under prescribed optical conditions on a 20% transmittance half-tone phase shift mask, in the first exposure process.
Figure 25:
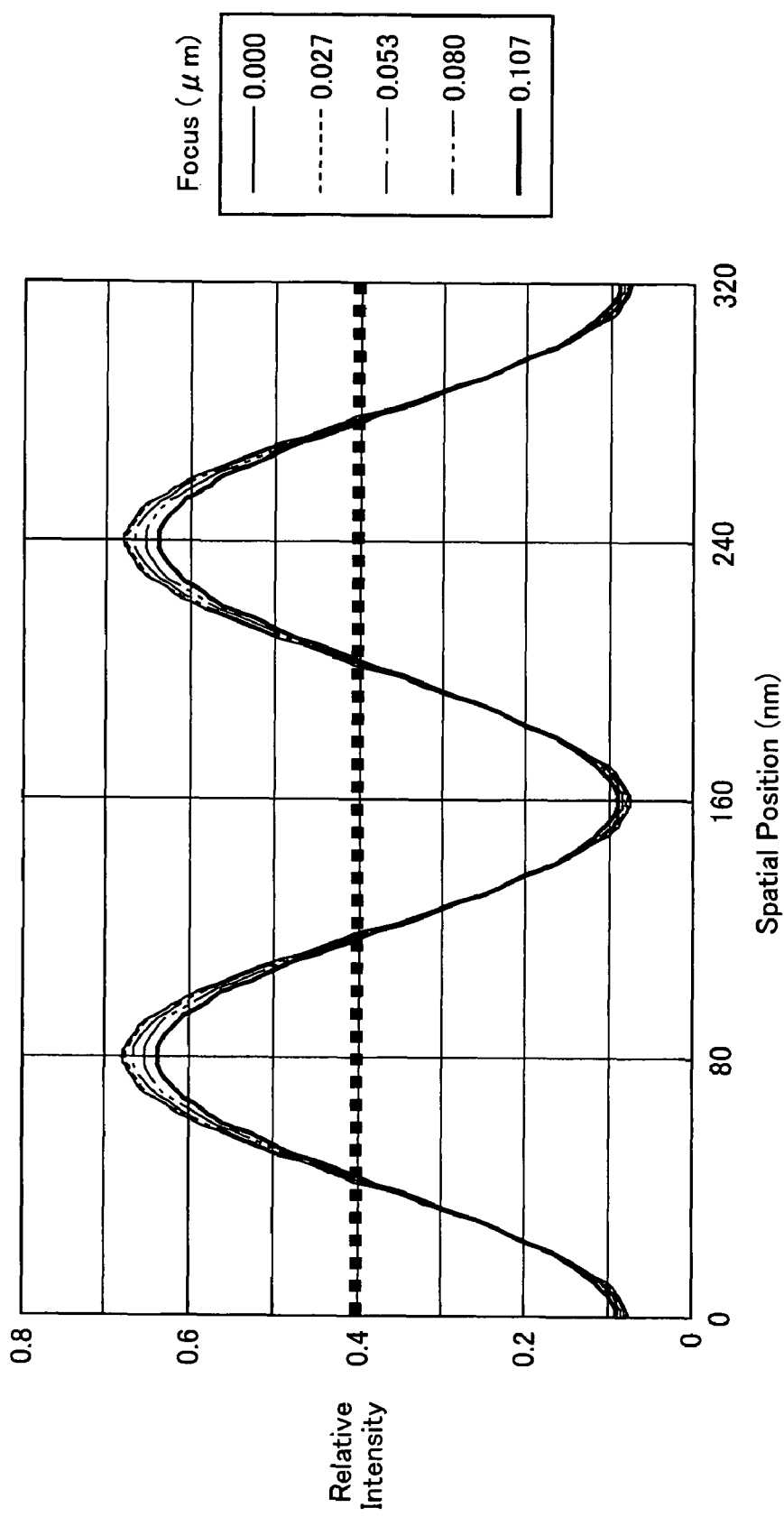
FIG. 25 represents optical intensity distribution at positions along a main cross-section of the dense holes in the first exposure process, using focus as a parameter.

FIG. 24 is a contour line map representing intensity distribution of an optical image of a pattern of 112 nm×112 nm holes arranged densely in two-dimension with a pitch of 160 nm formed on a 20% transmittance half-tone phase shift mask 20, in the first exposure process. Optical conditions are as follows: exposure light wavelength is 193 nm, numerical aperture NA is 1.07, and illumination is quadrupole illumination ($\sigma_{in}/\sigma_{out}$=0.85/0.95). FIG. 25 represents relative intensity distribution at positions (spatial positions) along a main cross-section of the dense holes in the first exposure process, using focus as a parameter. Referring to FIGS. 24 and 25, the optical image obtained in the first exposure process has sufficient contrast to attain resist resolution, and superior focusing characteristic with small variation with focus. It can be seen that, because of such characteristics of the optical image, a pattern of dense holes having the diameter of up to 60 nm and the pitch of 160 nm can be formed in the first photo-resist 3 with high margin.

Figure 26:
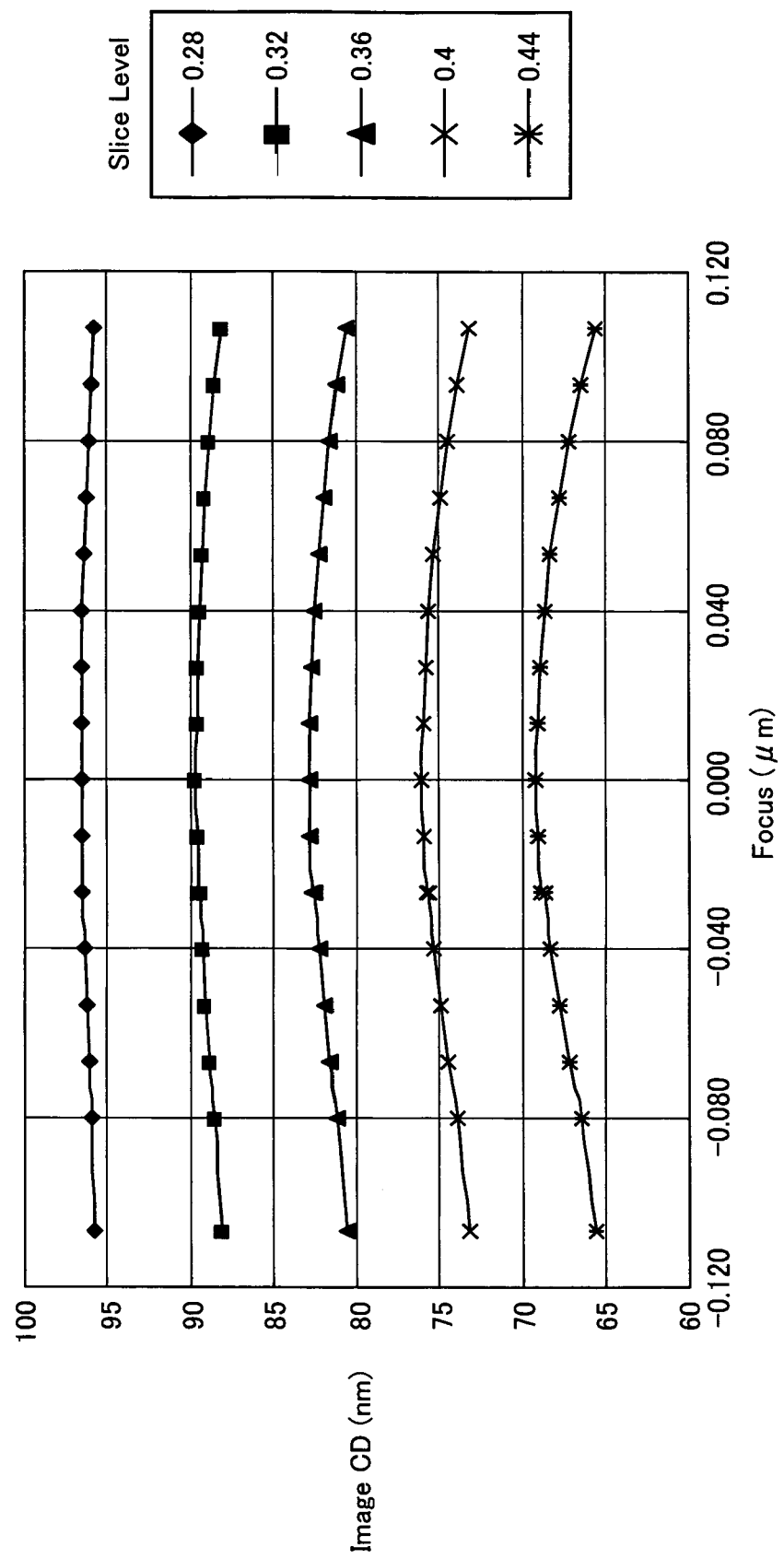
FIG. 26 plots dimension of bright point image formed in the first exposure process, that is, Image CD with respect to the focus, using slice level as a parameter.

FIG. 26 plots dimension of bright point image formed in the first exposure process, that is, Image CD (Critical Dimension) with respect to the focus, using slice level (amount in inverse proportion to the amount of exposure) as a parameter. Referring to FIG. 26, in the first exposure process, there is little CD value variation caused by defocus and it can be seen that superior focusing characteristic can be realized.

Figure 27:
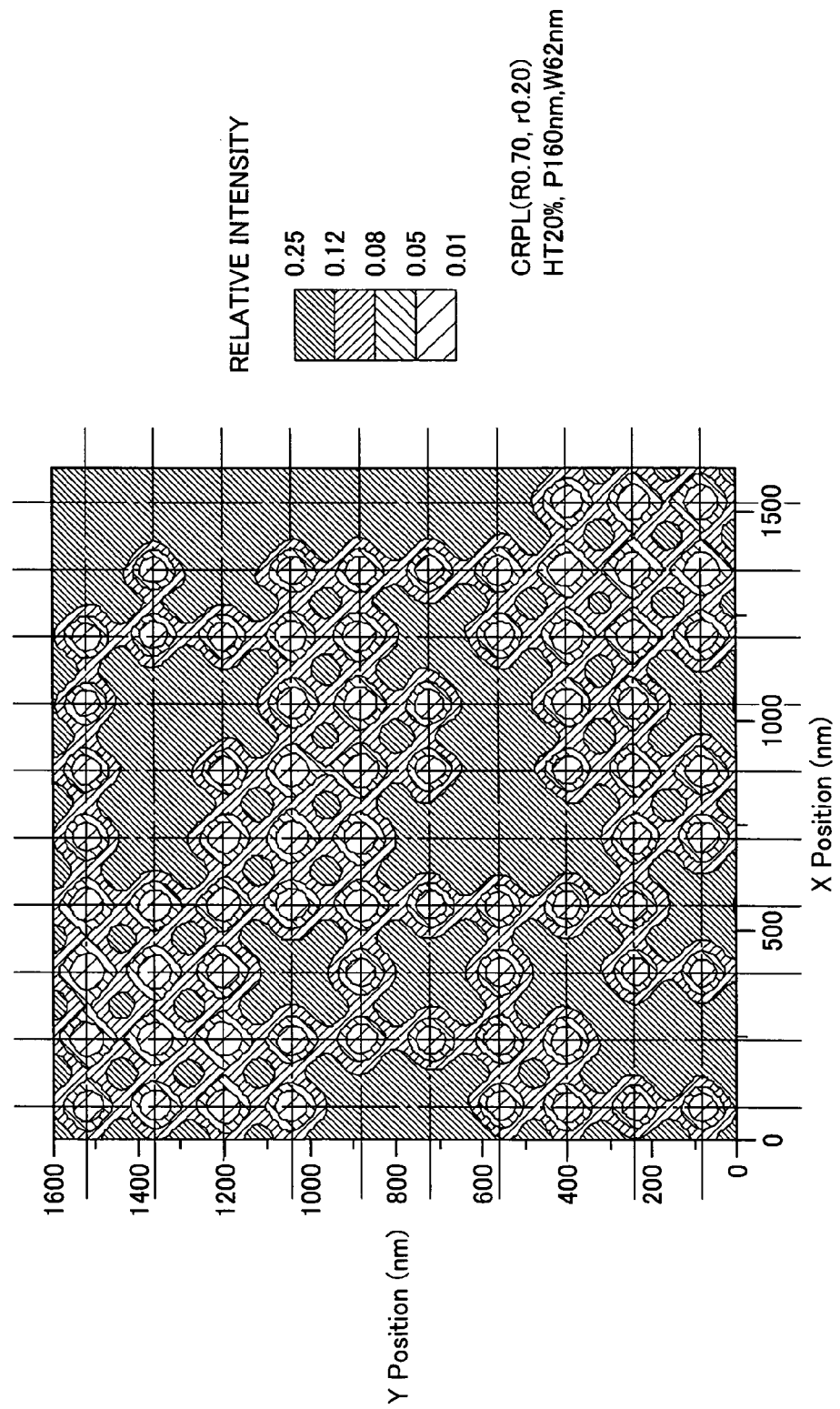
FIG. 27 is a contour line map representing intensity distribution of an optical image of a pattern of 62 nm×62 nm holes formed under prescribed optical conditions on a 20% transmittance half-tone phase shift mask, in the second exposure process.

FIG. 27 is a contour line map representing intensity distribution of an optical image of a pattern of 62 nm×62 nm holes formed on a 20% transmittance half-tone phase shift mask 30, in the second exposure process. Optical conditions are as follows: exposure light wavelength is 193 nm, numerical aperture NA is 1.07, and illumination is cross-pole illumination ($\sigma_{in}/\sigma_{out}$=0.60/0.80). The hole pattern of 62 nm×62 nm is arranged corresponding to a position of a part of the pattern of holes formed in the first photo-resist 3. Referring to FIG. 27, in the optical image, portions corresponding to the pattern of holes on the 20% transmittance half-tone phase shift mask 30 appear as dark point images because of phase cancellation.

Because of the dark point image, the second positive photo-resist 4 at the corresponding portion is not dissolved at the time of development and, therefore, the second photo-resist 4 of this portion (dot pattern portion) is left after development. Consequently, part of the plurality of holes of the pattern formed in photo-resist 3 as an underlying layer is plugged by the dot pattern portion of the second photo-resist 4. This is the purpose of the second exposure process.

Figure 28:
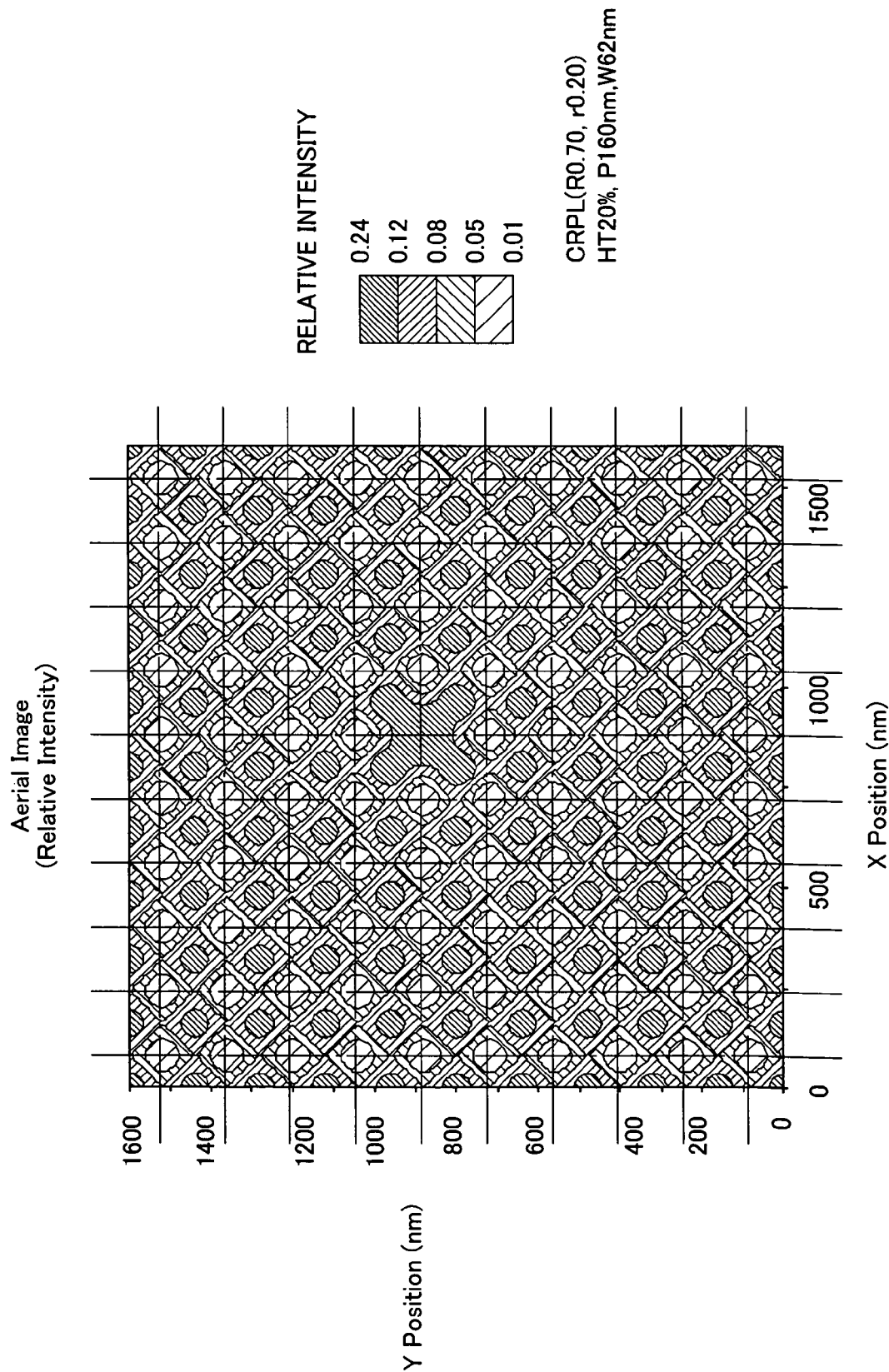
FIG. 28 is a contour line map representing intensity distribution of an optical image of a pattern of 62 nm×62 nm holes formed under prescribed optical conditions on a 20% transmittance half-tone phase shift mask 30, in the second exposure process.

FIG. 28 is a contour line map representing intensity distribution of an optical image of a pattern of 62 nm×62 nm holes formed under the above-described optical conditions on a 20% transmittance half-tone phase shift mask 30, in the second exposure process. The hole pattern of 62 nm×62 nm is arranged corresponding to all the holes of the pattern except for one hole, among the pattern of plurality of holes formed in the first photo-resist 3. Referring to FIG. 28, in the optical image, the portions corresponding to the pattern of holes on the 20% transmittance half-tone phase shift mask 30 are dark portions because of phase cancellation, while the portion free of any hole pattern on mask 30 is a bright portion. Specifically, in the patterning of the second photo-resist 4 using mask 30, all the holes except for one hole of the pattern of dense holes formed in the first photo-resist 3 are plugged by the pattern of dots of the second photo-resist 4 formed by the dark point image. In this manner, a pattern of isolated hole can be formed in the film 2 as the object of processing.

Figure 29:
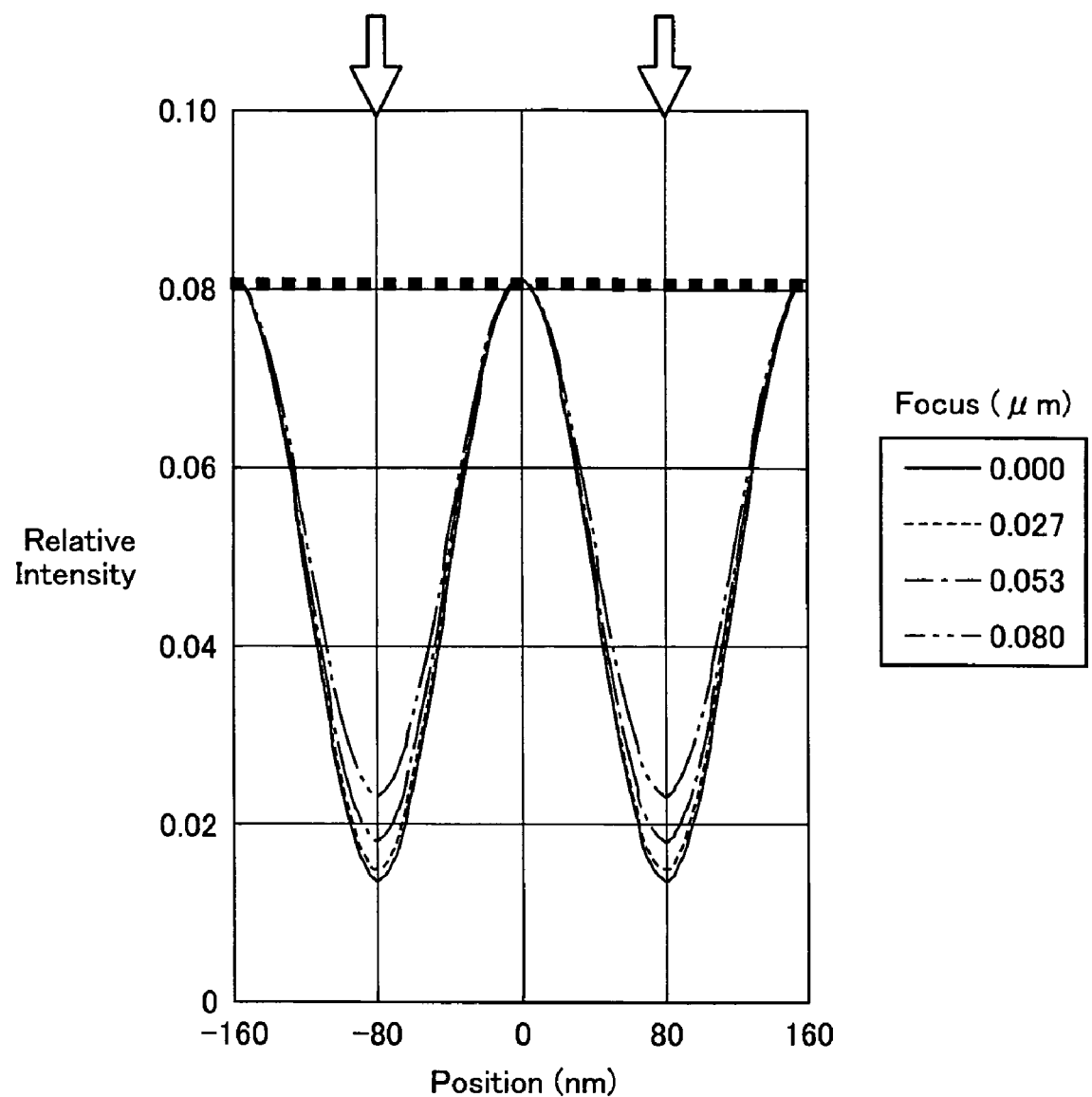
FIG. 29 plots optical image intensity at portions free of any hole of the mask used in the second exposure process, using focus as a parameter.
Figure 30:
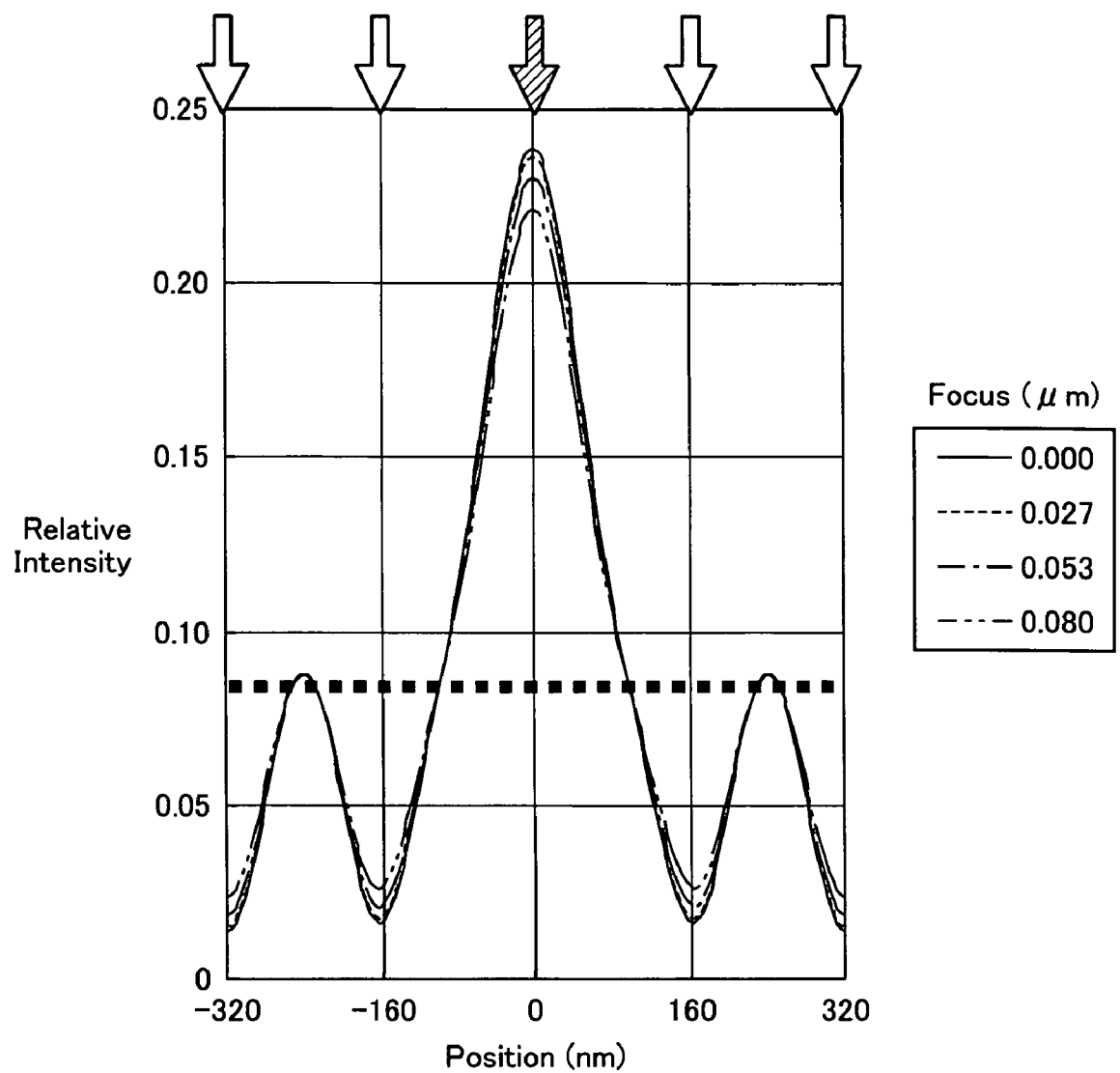
FIG. 30 plots optical image intensity at portions with isolated hole of the mask used in the second exposure process, using focus as a parameter.

FIGS. 29 and 30 plot optical image intensity at a portion free of any hole (FIG. 29) and at a portion with isolated hole (FIG. 30) of the mask used in the second exposure process, using focus as a parameter. In the figure, image intensity (slice level: adjusted by the amount of exposure) as the border as to whether the resist is dissolved or not, is shown by a dotted line.

Referring to FIGS. 29 and 30, both the dot pattern portion (plug formed portion) where the holes are non-existent and the dot pattern portion (plug formed portion) where the isolated hole exists are sufficiently dark for resist resolution. Further, variation of optical intensity with focus is small. Specifically, it is expected that formation of a dot pattern with sufficient process margin is possible by exposing the optical image. Further, at the hole pattern portion where the isolated hole exists, a bright point image having sufficient intensity to cause reaction of the second photo-resist 4 is formed.

From the foregoing, it is understood that by the present embodiment, a pattern of dense holes can be formed in the first positive photo-resist 3 using half-tone phase shift mask 20 and modified illumination in the first exposure process. Thereafter, in the second exposure process, by an image of dark points arranged at random formed by using high transmittance half-tone phase shift mask 30 and cross-pole illumination, part of the holes 3a of the pattern of dense holes formed in the first exposure process can arbitrarily be filled by the pattern of dots provided by the second photo-resist 4. Accordingly, the pattern of randomly arranged holes can be formed. Thus, it becomes possible to simultaneously form a pattern of dense holes with very small pitch and a pattern of random arrangement including an isolated hole, of minute dimensions, which could not be formed by the conventional method.

Embodiment 2

The present embodiment differs from Embodiment 1 in that cross-pole illumination shown in FIG. 17 is used as the modified illumination of the first exposure process shown in FIG. 5. When the cross-pole illumination is used for the first exposure process, holes 12a in the pattern of dense holes of half-tone phase shift mask 20 shown in FIG. 5 have the arrangement pitch P1 of, for example, 120 nm and two-dimensional dimension is, for example, 88 nm×88 nm. Further, holes 3a of the pattern of dense holes in the first photo-resist 3 formed by using half-tone phase shift mask 20 have the arrangement pitch of, for example, 120 nm, and the diameter of, for example, 60 nm.

Except for this point, the method of pattern formation and the structure of electronic device of the present embodiment are substantially the same as those of Embodiment 1 and, therefore, description thereof will not be repeated.

Next, results of inspection of the optical images in the first and second exposure processes of the present embodiment will be described.

Figure 31:
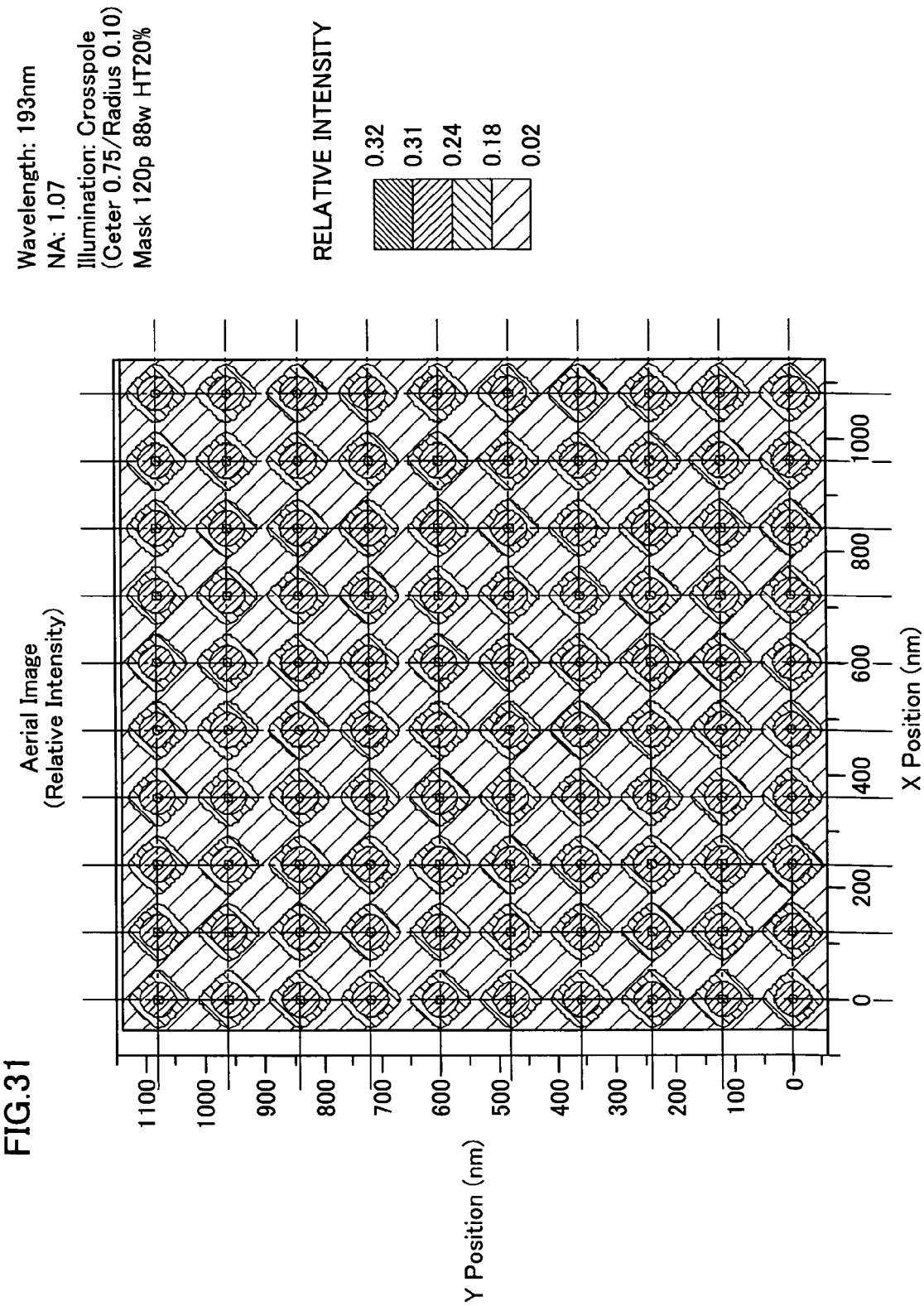
FIG. 31 is a contour line map representing intensity distribution of an optical image of a pattern of 88 nm×88 nm holes arranged densely in two-dimension with a pitch of 120 nm, formed under prescribed optical conditions on a 20% transmittance half-tone phase shift mask 20, in the first exposure process.
Figure 32:
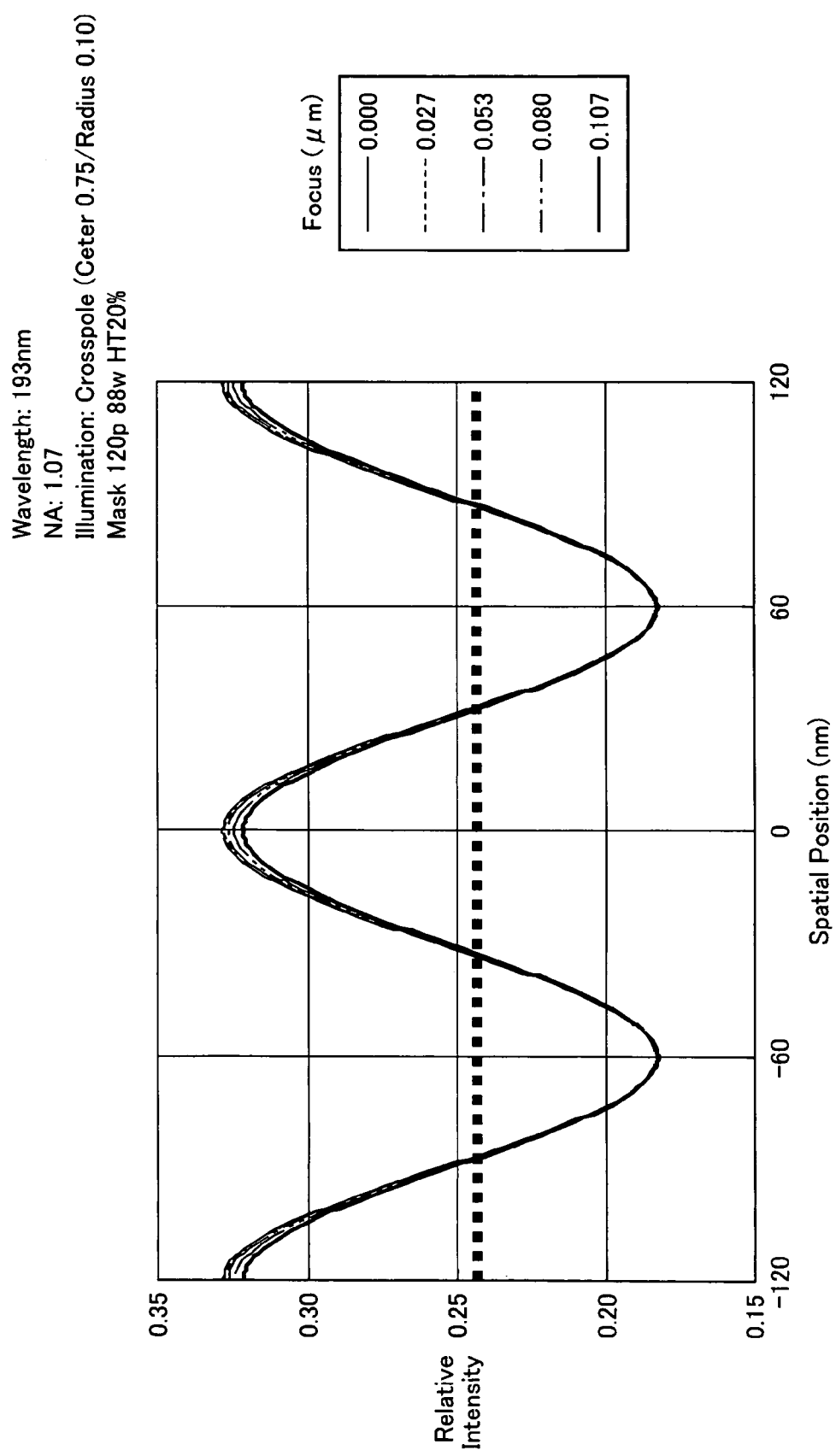
FIG. 32 represents optical intensity distribution at positions along a main cross-section of the dense holes in the first exposure process, using focus as a parameter.

FIG. 31 is a contour line map representing intensity distribution of an optical image of a pattern of 88 nm×88 nm holes arranged densely in two-dimension with a pitch of 120 nm on a 20% transmittance half-tone phase shift mask 20, in the first exposure process. Optical conditions are as follows: exposure light wavelength is 193 nm, numerical aperture NA is 1.07, and illumination is cross-pole illumination ($\sigma_{in}/\sigma_{out}$=0.70/0.80). FIG. 32 represents relative intensity distribution at positions (spatial positions) along a main cross-section of the dense holes in the first exposure process, using focus as a parameter. Referring to FIGS. 31 and 32, the optical image obtained in the first exposure process has sufficient contrast to attain resist resolution, and superior focusing characteristic with small variation with focus. It can be seen that, because of such characteristics of the optical image, a pattern of dense holes having the diameter of up to 60 nm and the pitch of 120 nm can be formed in the first photo-resist 3 with high margin.

Figure 33:
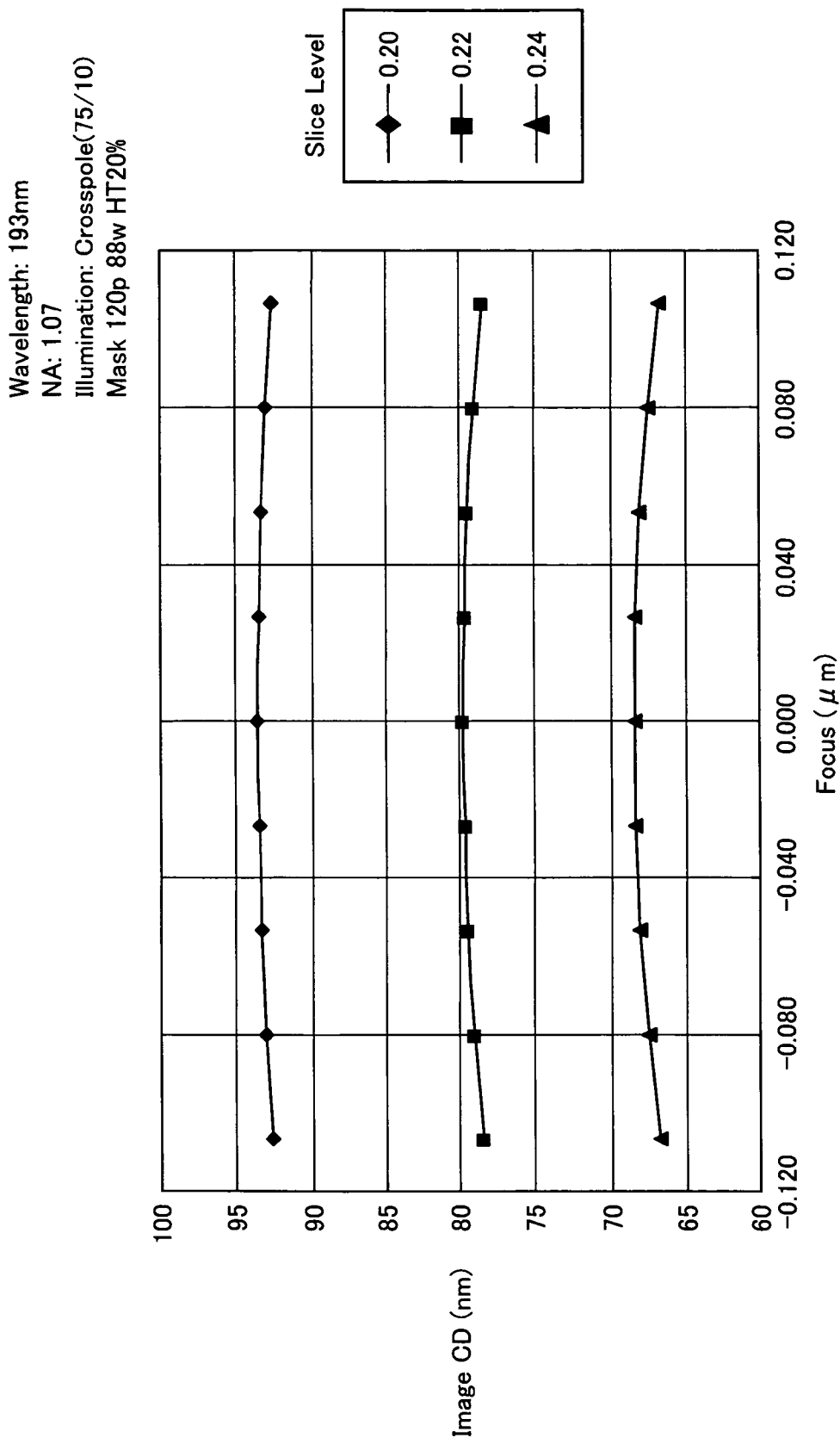
FIG. 33 plots dimension of bright point image formed in the first exposure process, that is, Image CD with respect to the focus, using slice level as a parameter.

FIG. 33 plots dimension of bright point image formed in the first exposure process, that is, Image CD with respect to the focus, using slice level as a parameter. Referring to FIG. 33, in the first exposure process, there is little CD value variation caused by defocus and it can be seen that superior focusing characteristic can be realized.

Figure 34:
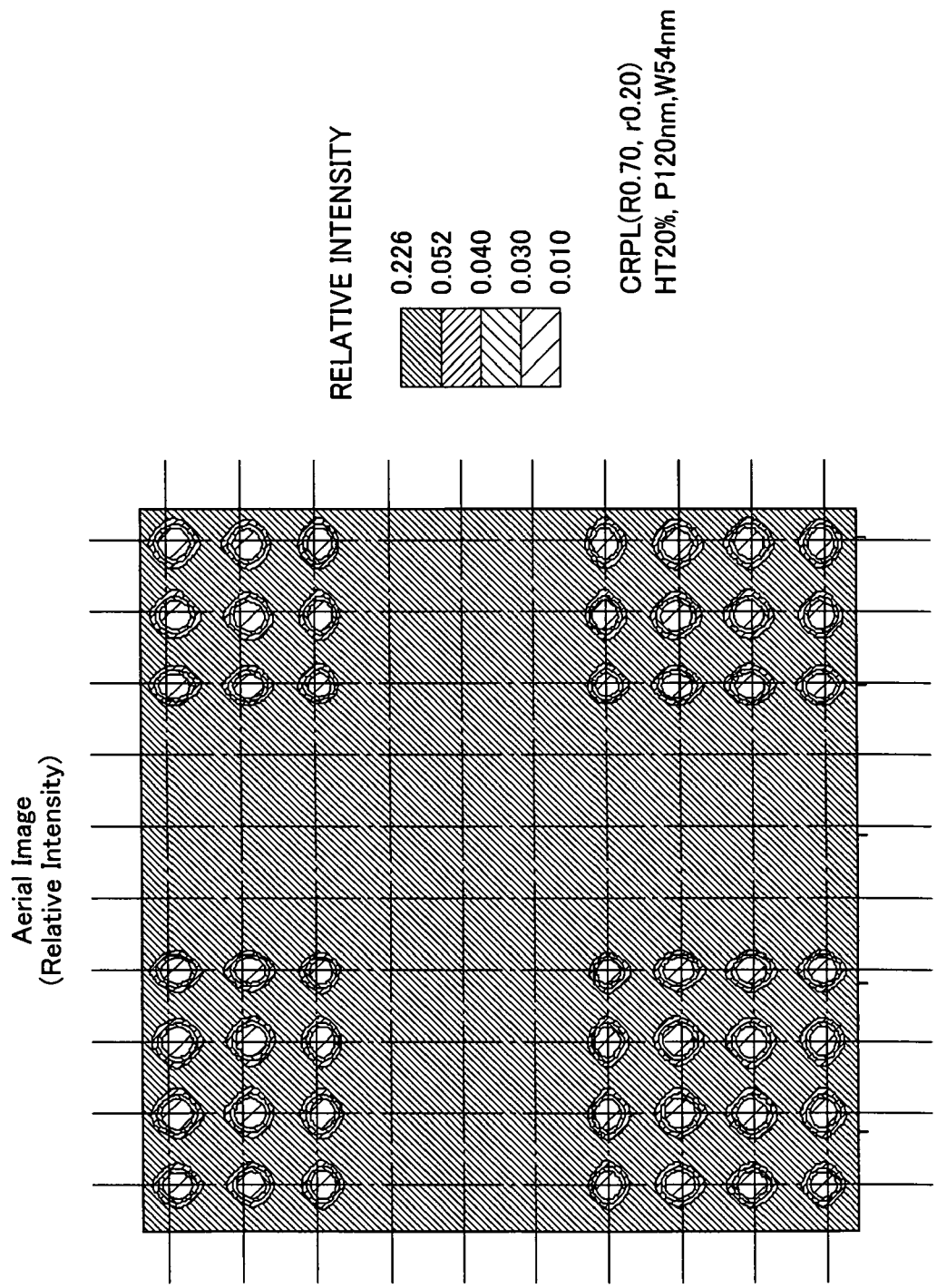
FIG. 34 is a contour line map representing intensity distribution of an optical image of a pattern of 54 nm×54 nm holes formed under prescribed optical conditions on a 20% transmittance half-tone phase shift mask 30, in the second exposure process.

FIG. 34 is a contour line map representing intensity distribution of an optical image of a pattern of 54 nm×54 nm holes formed on a 20% transmittance half-tone phase shift mask 30, in the second exposure process. Optical conditions are as follows: exposure light wavelength is 193 nm, numerical aperture NA is 1.07, and illumination is cross-pole illumination ($\sigma_{in}/\sigma_{out}$=0.60/0.80). The hole pattern of 54 nm×54 nm is arranged corresponding to a position of a part of the pattern of holes formed in the first photo-resist 3. Referring to FIG. 34, in the optical image, portions corresponding to the pattern of holes on the 20% transmittance half-tone phase shift mask 30 appear as dark points because of phase cancellation.

Because of the dark point image, the second positive photo-resist 4 at the corresponding portion is not dissolved at the time of development and, therefore, the second photo-resist 4 of this portion (dot pattern portion) is left after development. Consequently, part of the plurality of holes of the pattern formed in photo-resist 3 as an underlying layer is plugged by the dot pattern portion of the second photo-resist 4. This is the purpose of the second exposure process.

Figure 35:
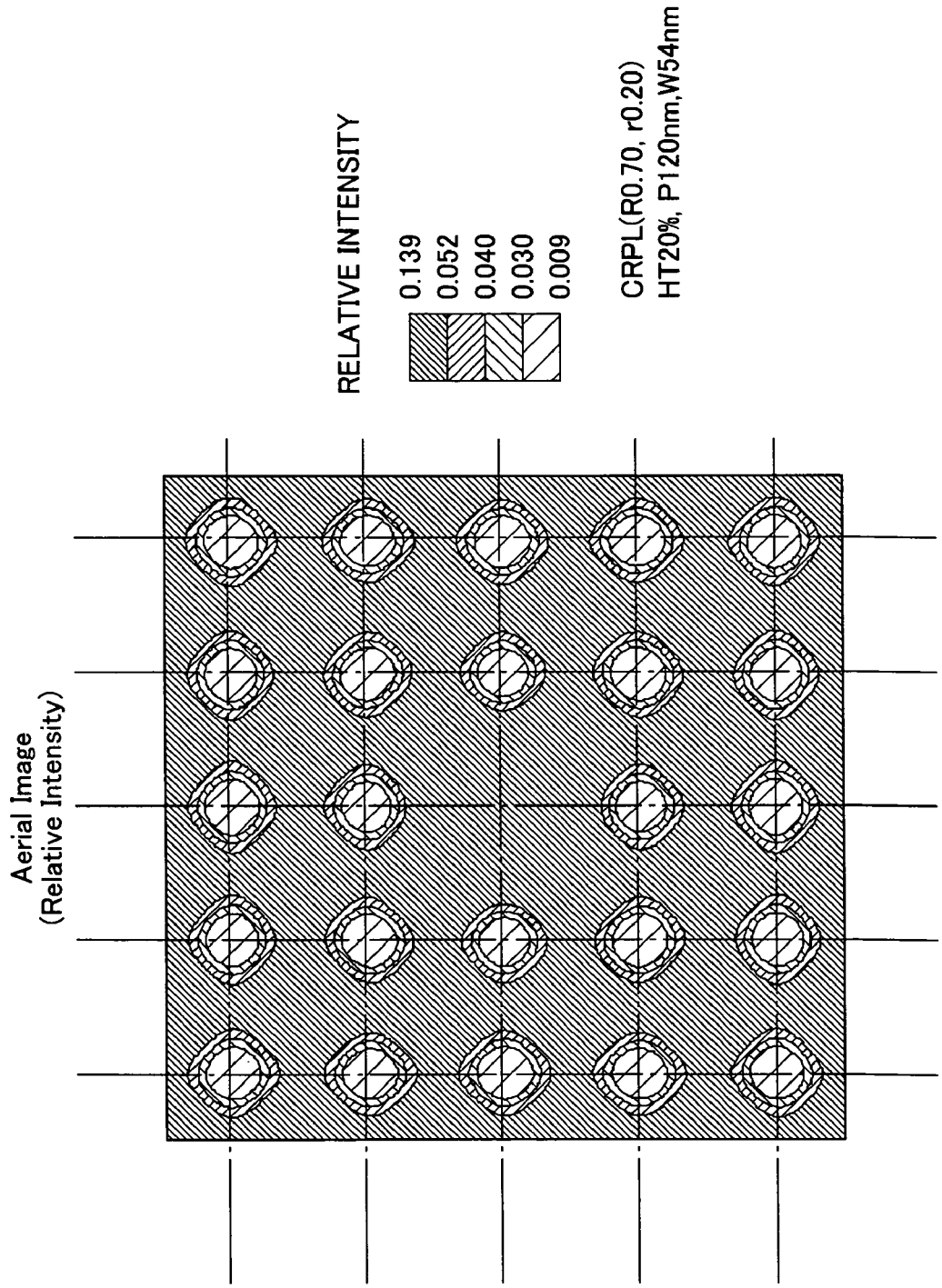
FIG. 35 is a contour line map representing intensity distribution of an optical image of a pattern of 54 nm×54 nm holes formed under prescribed optical conditions on a 20% transmittance half-tone phase shift mask 30, in the second exposure process.

FIG. 35 is a contour line map representing intensity distribution of an optical image of a pattern of 54 nm×54 nm holes formed under the above-described optical conditions on a 20% transmittance half-tone phase shift mask 30, in the second exposure process. The hole pattern of 54 nm×54 nm is arranged corresponding to all the holes of the pattern except for one hole, among the pattern of plurality of holes formed in the first photo-resist 3. Referring to FIG. 35, in the optical image, the portions corresponding to the pattern of holes on the 20% transmittance half-tone phase shift mask 30 are dark portions because of phase cancellation, while the portion free of any hole pattern on mask 30 is a bright portion. Specifically, in the patterning of the second photo-resist 4 using mask 30, all the holes except for one hole of the pattern of dense holes formed in the first photo-resist 3 are plugged by the pattern of dots of the second photo-resist 4 formed by the dark point image. In this manner, a pattern of isolated hole can be formed in the film 2 as the object of processing.

Figure 36:
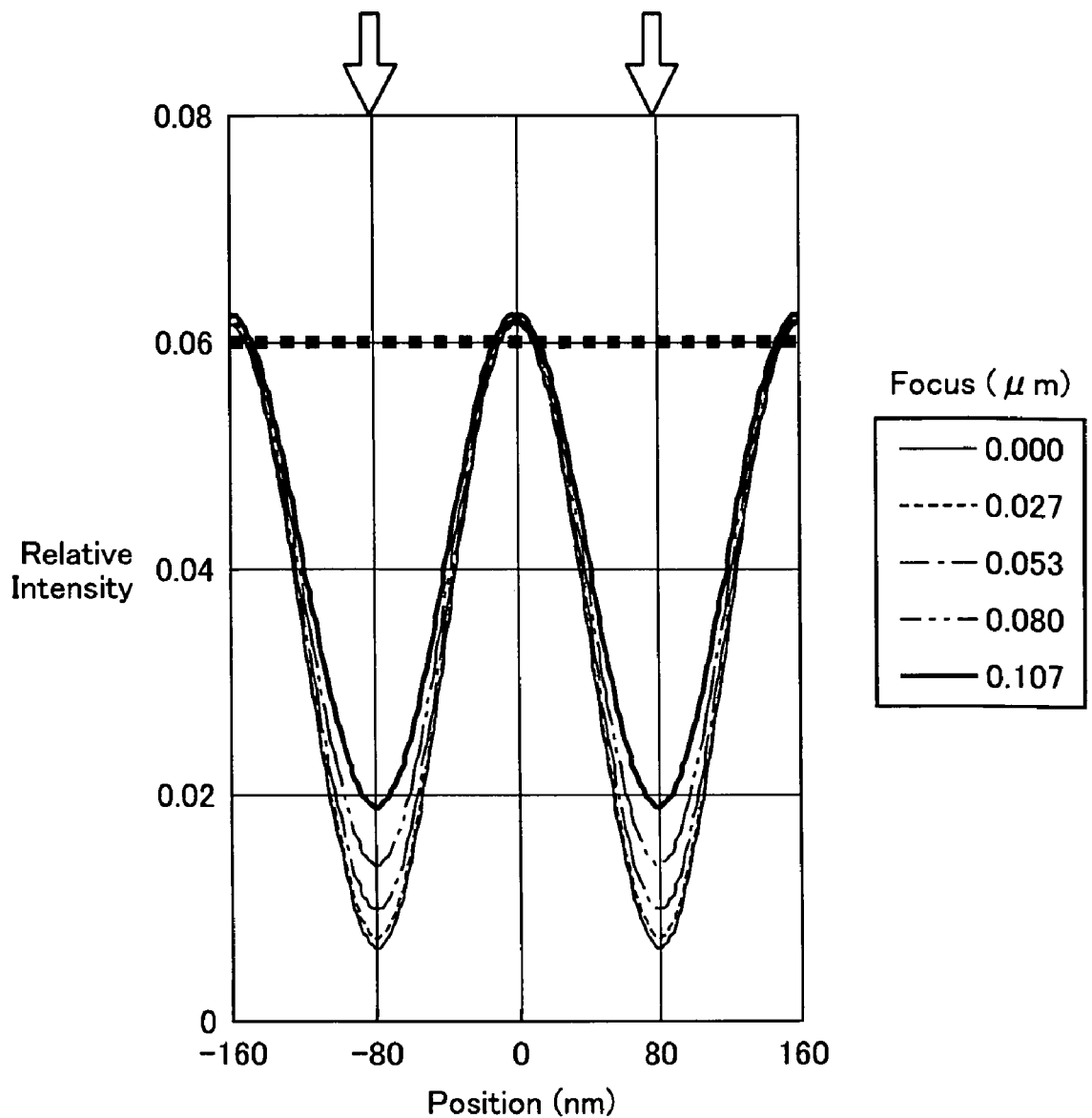
FIG. 36 plots optical image intensity at portions free of any hole of the mask used in the second exposure process, using focus as a parameter.
Figure 37:
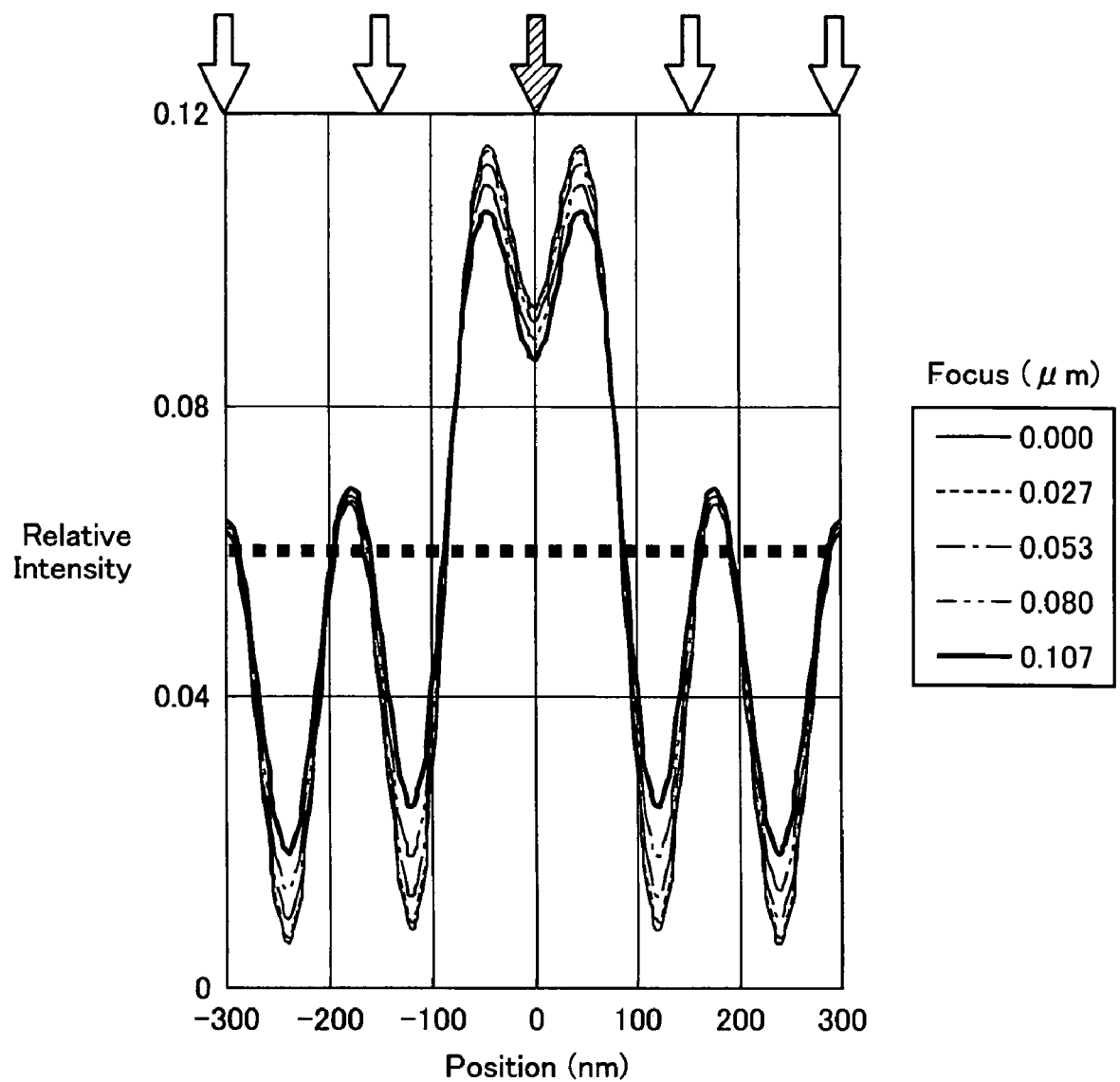
FIG. 37 plots optical image intensity at portions with isolated hole of the mask used in the second exposure process, using focus as a parameter.

FIGS. 36 and 37 plot optical image intensity at a portion free of any hole (FIG. 36) and at a portion with isolated hole (FIG. 37) of the mask used in the second exposure process, using focus as a parameter. In the figure, image intensity (slice level: adjusted by the amount of exposure) as the border as to whether the resist is dissolved or not, is shown by a dotted line.

Referring to FIGS. 36 and 37, both the dot pattern portion (plug formed portion) where the holes are non-existent and the dot pattern portion (plug formed portion) where the isolated hole exists are sufficiently dark for resist resolution. Further, variation of optical intensity with focus is small. Specifically, it is expected that formation of a dot pattern with sufficient process margin is possible by exposing the optical image. Further, at the hole pattern portion where the isolated hole exists, a bright point image having sufficient intensity to cause reaction of the second photo-resist 4 is formed.

From the foregoing, it is understood that by the present embodiment, a pattern of dense holes can be formed in the first positive photo-resist 3 using half-tone phase shift mask 20 and modified illumination in the first exposure process. Thereafter, in the second exposure process, by an image of dark points arranged at random formed by using high transmittance half-tone phase shift mask 30 and cross-pole illumination, part of the holes 3a of the pattern of dense holes formed in the first exposure process can arbitrarily be filled by the pattern of dots provided by the second photo-resist 4. Accordingly, the pattern of randomly arranged holes can be formed. Thus, it becomes possible to simultaneously form a pattern of dense hole patterns with very small pitch and a pattern of random arrangement including an isolated hole, of minute dimensions, which could not be formed by the conventional method.

Embodiment 3

The present embodiment differs from Embodiment 1 in that the mask layer in the flowchart of FIG. 1 is a hard mask.

In the following, an example in which the mask layer of the flowchart of FIG. 1 is a hard mask will be specifically described.

Figure 38:
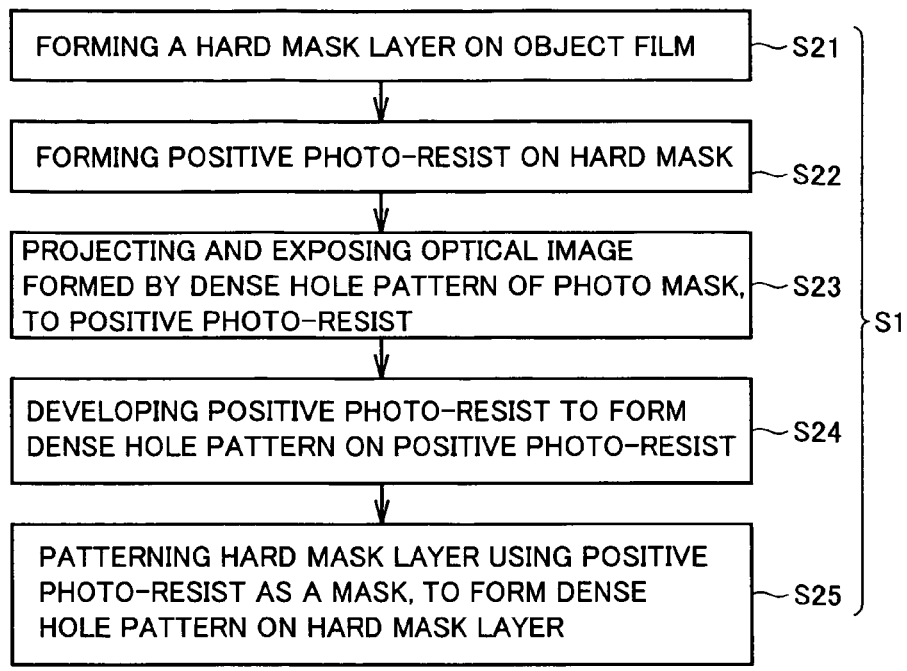
FIG. 38 is a flowchart specifically representing step S1 of FIG. 1 when the mask layer is a hard mask layer.
Figure 39:
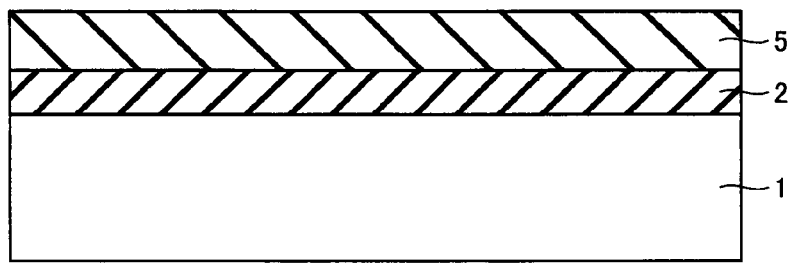
FIGS. 39 to 49 are schematic cross-sectional views showing, in order, steps of the pattern forming method in accordance with Embodiment 3.

Referring to FIG. 39, first, the film 2 as the object of processing is formed on a substrate (for example, a wafer) 1. On the film 2 as the object of processing, a hard mask layer 5 is formed (step S21: FIG. 38). Hard mask layer 5 is formed of a material different from the resist material. For example, it is formed of a silicon nitride film.

Figure 40:
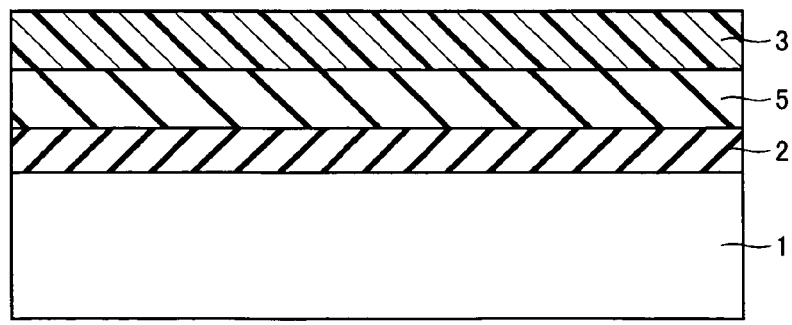

Referring to FIG. 40, on hard mask 5, a first positive photo-resist 3 is applied and formed (step S22: FIG. 38). At this time, though not shown, a bottom anti-reflection coating (BARC) and a top anti-reflection coating (TARC) are formed as upper and lower layers of the first positive photo-resist 3, as needed.

Figure 41:
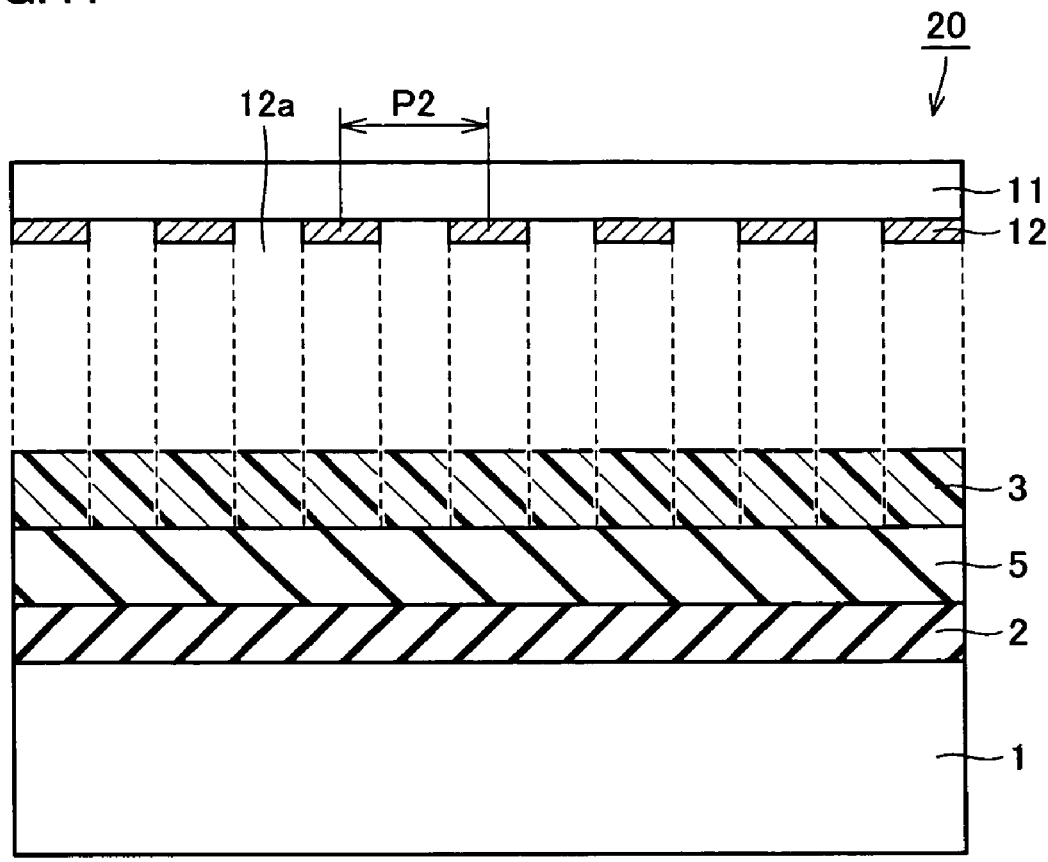

Referring to FIG. 41, the first exposure process is performed. An optical image of a 20% transmittance half-tone phase shift mask 20 having a pattern of dense holes formed therein is projected to the first positive photo-resist 3 by a projection optical system, using quadrupole illumination, whereby the first positive photo-resist is exposed (step S23: FIG. 38). In the present embodiment, an immersion lithography system having the exposure wavelength ($\lambda$) of, for example, 193 nm, and numerical aperture (NA) of, for example, 1.07 is used.

The structure of half-tone phase shift mask 20 is substantially the same as that of half-tone phase shift mask 20 in accordance with Embodiment 1 and, therefore, description thereof will not be repeated.

Figure 42:
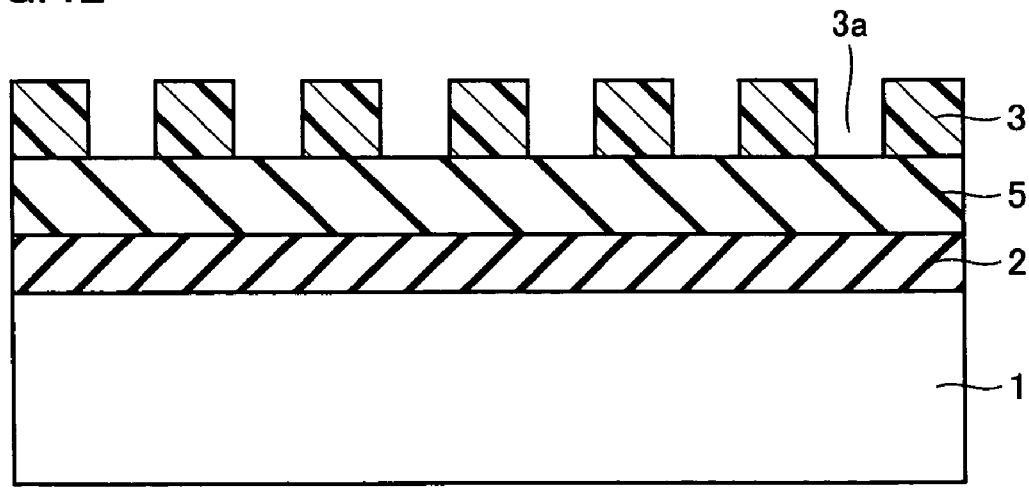

Referring to FIG. 42, the first positive photo-resist having the optical image of a pattern of dense holes exposed as described above is developed. Consequently, a pattern of a plurality of holes 3a is formed in the first photo-resist 3. Each of the plurality of holes 3a of the pattern is arranged regularly, by way of example, with the arrangement pitch of 160 nm and the diameter of 60 nm, whereby a pattern of dense holes is formed (step S24: FIG. 38).

Figure 43:
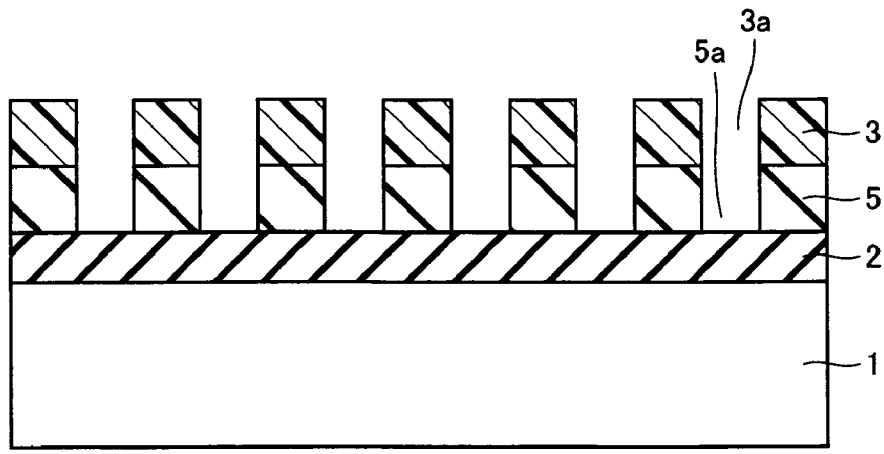

Referring to FIG. 43, using the first photo-resist having the pattern of dense holes as a mask, the BARC film and hard mask layer 5 are selectively removed by dry etching. Thereafter, the first photo-resist 3 is fully separated and removed together with the BARC film.

Figure 44:
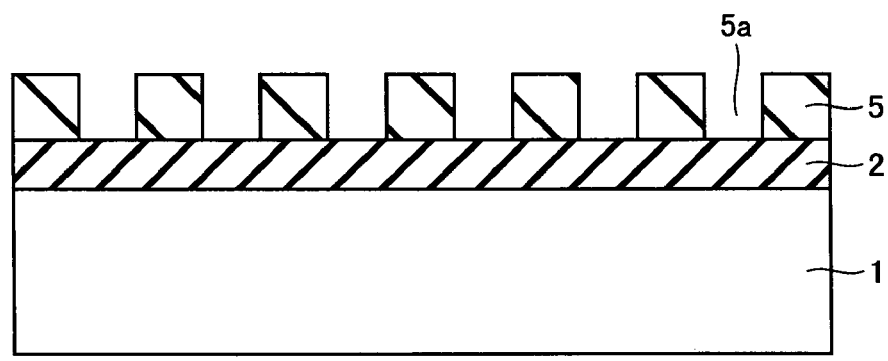

Referring to FIG. 44, a pattern of dense holes having a plurality of holes Sa arranged regularly is formed in hard mask layer 5 (step S25: FIG. 38).

Figure 45:
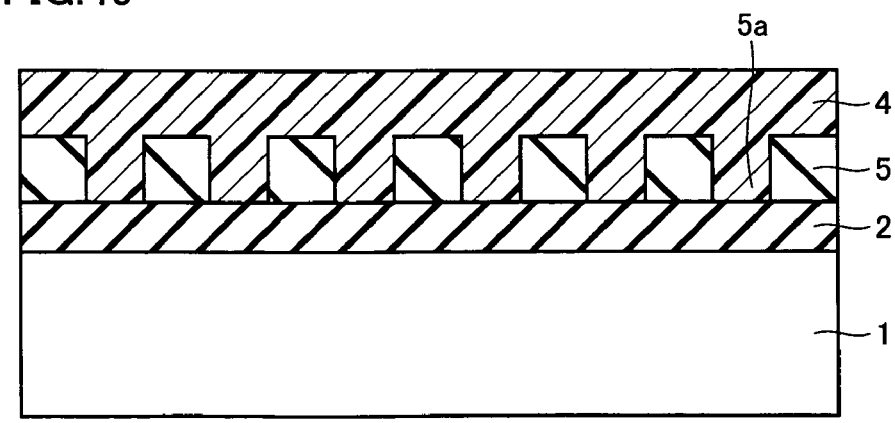

Referring to FIG. 45, on hard mask layer 5 having the pattern of dense holes formed therein, the second positive photo-resist 4 is applied and formed to fill each of the plurality of holes 5a of the pattern (step S2: FIG. 1). At this time, though not shown, a bottom anti-reflection coating (BARC) and a top anti-reflection coating (TARC) are formed as upper and lower layers of the second positive photo-resist 4 as needed. The TARC film is necessary for precise pattern formation and, therefore, it is also applied in the process for forming the second photo-resist 4.

Figure 46:
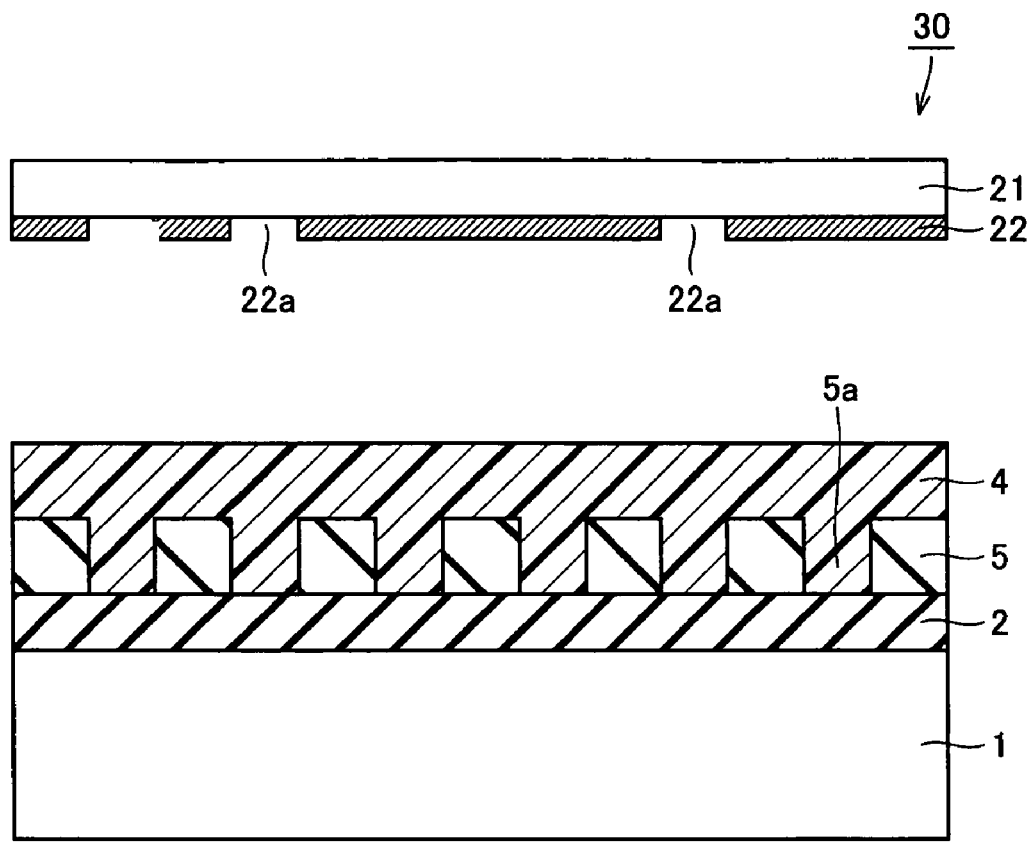

Referring to FIG. 46, the second exposure process is performed. An optical image of a high-transmittance half-tone phase shift mask 30 having a pattern of randomly arranged holes formed therein is projected to the second positive photo-resist 4 by a projection optical system using a cross-pole illumination, and the second photo-resist 4 is exposed (step S3: FIG. 1). In the present embodiment, immersion lithography system having the exposure wavelength ($\lambda$) of, for example, 193 nm, and numerical aperture (NA) of, for example, 1.07 is used.

The structure of high-transmittance half-tone phase shift mask 30 is substantially the same as that of the high-transmittance half-tone phase shift mask 30 in accordance with Embodiment 1 and, therefore, description thereof will not be repeated.

In the exposure using high-transmittance half-tone phase shift mask 30, the bright-dark inverted image of the pattern of half-tone phase shift film 22 is projected to the second photo-resist 4. Specifically, in an ordinary half-tone phase shift mask, the region where the half-tone phase shift film is formed becomes the dark portion and the region where the opening is formed becomes the bright portion, whereas in the case of the high-transmittance half-tone phase shift mask 30, the region where high transmittance phase shift film 22 is formed becomes the bright portion and the region where opening 22a is formed becomes the dark portion.

Therefore, the exposure light transmitted through the region where high-transmission half-tone phase shift film 22 relatively larger than the wavelength is formed comes to have such an optical intensity that dissolves the second positive photo-resist 4 at the time of development. The exposure light transmitted through opening 22a comes to have such an optical intensity that does not dissolve the second positive photo-resist 4 at the time of development.

Figure 47:
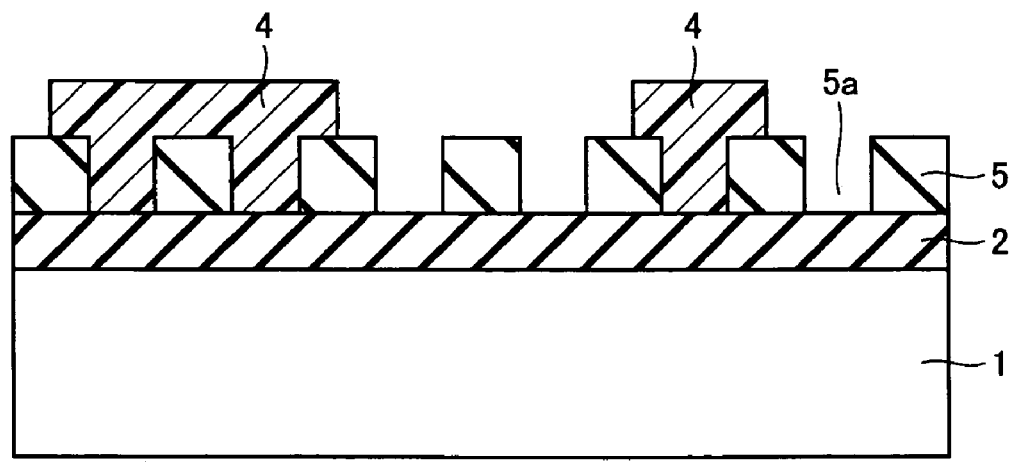

Referring to FIG. 47, the second positive photo-resist 4 having the image of randomly arranged dark points exposed as described above is developed. Consequently, the portions of dark point image of the second photo-resist 4 are left as a pattern of dots 4 in some of the plurality of holes 5a of the pattern of hard mask layer 5 (step S4: FIG. 1). As the dots 4 of the pattern fill holes 5a of the pattern, a pattern of holes arranged at random when viewed two-dimensionally can be obtained.

Figure 48:
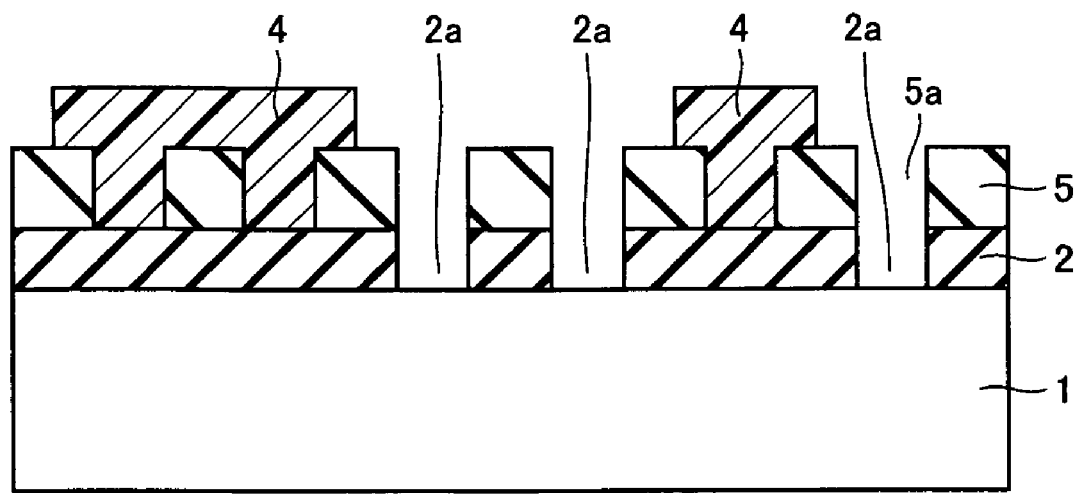

Referring to FIG. 48, using the second photo-resist 4 and hard mask layer 5 as a mask, the film 2 as the object of processing is selectively removed and patterned by etching (step S5: FIG. 1). Thereafter, the first photo-resist 3 is removed, for example, by ashing, and hard mask layer 5 is removed, for example, by etching.

Figure 49:
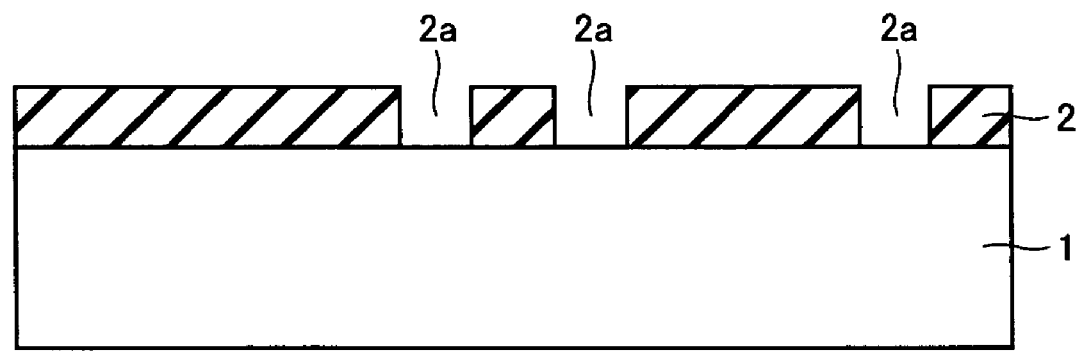

Referring to FIG. 49, by the etching, a pattern of holes 2a arranged at random when viewed two-dimensionally is formed on the film 2 as the object of processing, and the pattern in accordance with the present embodiment is formed. The pattern formed in this manner may be applicable to an electronic device.

The structure of the electronic device having the pattern obtained through the pattern forming method in accordance with the present embodiment is substantially the same as that of the electronic device in accordance with Embodiment 1 shown in FIG. 19 and, therefore, description thereof will not be repeated.

The results of inspection of optical images in the first and second exposure processes of the present embodiment are approximately the same as those of Embodiment 1 shown in FIGS. 24 to 30 and, therefore, description thereof will not be repeated.

From the foregoing, it is understood that by the present embodiment, a pattern of dense holes can be formed in the first positive photo-resist 3 using half-tone phase shift mask 20 and modified illumination in the first exposure process. Further, using the first photo-resist 3 as a mask, a pattern of dense holes can be transferred to the hard mask layer 5. Thereafter, in the second exposure process, by an image of dark points arranged at random formed by using high transmittance half-tone phase shift mask 30 and cross-pole illumination, part of the holes 5a of the pattern of dense holes in the hard mask layer 5 can arbitrarily be filled by the pattern of dots provided by the second photo-resist 4. Accordingly, the pattern of randomly arranged holes can be formed. Thus, it becomes possible to simultaneously form a pattern of dense hole patterns with very small pitch and a pattern of random arrangement including an isolated hole, of minute dimensions, which could not be formed by the conventional method.

Embodiment 4

The present embodiment differs from Embodiment 3 in that cross-pole illumination shown in FIG. 17 is used as the modified illumination in the first exposure process shown in FIG. 41. When the cross-pole illumination is used for the first exposure process, holes 12a in the pattern of dense holes of half-tone phase shift mask 20 shown in FIG. 41 have the arrangement pitch P2 of, for example, 120 nm and two-dimensional dimension is, for example, 88 nm×88 nm. Further, holes 3a of the pattern of dense holes in the first photo-resist 3 formed by using half-tone phase shift mask 20 have the arrangement pitch of, for example, 120 nm, and the diameter of, for example, 60 nm.

Except for these points, the method of pattern formation and the structure of electronic device of the present embodiment are substantially the same as those of Embodiment 3 and, therefore, description thereof will not be repeated.

The results of inspection of optical images in the first and second exposure processes of the present embodiment are approximately the same as those of Embodiment 2 shown in FIGS. 31 to 37 and, therefore, description thereof will not be repeated.

From the foregoing, it is understood that by the present embodiment, a pattern of dense holes can be formed in the first positive photo-resist 3 using half-tone phase shift mask 20 and modified illumination in the exposure process. Further, using the first photo-resist 3 as a mask, a pattern of dense holes can be transferred to the hard mask layer 5. Thereafter, in the second exposure process, by an image of dark points arranged at random formed by using high transmittance half-tone phase shift mask 30 and cross-pole illumination, part of the holes 5a of the pattern of dense holes in the hard mask layer 5 can arbitrarily be filled by the pattern of dots provided by the second photo-resist 4. Accordingly, the pattern of randomly arranged holes can be formed. Thus, it becomes possible to simultaneously form a pattern of dense hole patterns with very small pitch and a pattern of random arrangement including an isolated hole, of minute dimensions, which could not be formed by the conventional method.

As described above, the pattern forming method in accordance with Embodiments 1 to 4 described above is to solve the problems of the prior art and to enable formation of a pattern of minute holes arranged at random, using a positive photo-resist.

In the pattern forming method in accordance with Embodiments 1 to 4 described above, pattern formation is continuously performed twice, whereby formation of a pattern having minute holes arranged at random using positive photo-resist becomes possible.

Further, in the pattern forming method in accordance with Embodiments 1 to 4 described above, by applying modified illumination in the first exposure process and by applying the bright-dark inverted image obtained by high-transmittance half-tone phase shift mask together with modified illumination in the second exposure process, pattern formation with high process margin becomes possible.

Further, in the pattern forming method in accordance with Embodiments 1 to 4 described above, by applying modified illumination in the first exposure process and by applying the bright-dark inverted image obtained by high-transmittance half-tone phase shift mask together with modified illumination in the second exposure process, pattern formation not requiring optical proximity correction (OPC) becomes possible.

Further, in the pattern forming method in accordance with Embodiments 1 to 4 described above, by applying modified illumination in the first exposure process and by applying the bright-dark inverted image obtained by high-transmittance half-tone phase shift mask together with modified illumination in the second exposure process, formation of a pattern having minute holes arranged at random through exposure with small numerical aperture (NA) becomes possible. This enables application of an inexpensive exposure machine and the cost of processing can be reduced.

Further, in the method of pattern formation in accordance with Embodiments 1 to 4 described above, cross-pole illumination is used in the second exposure process. Therefore, the optical image obtained in the second exposure process comes to have sufficient contrast to resolve the resist and superior focusing characteristic with small variation with focus. This point will be described in the following. In the description here, the exposure wavelength of 248 nm is used, different from the wavelength of 193 nm used in the embodiment. The physical phenomenon, however, is independent of the wavelength and, therefore, it is noted that the same phenomenon occurs with the wavelength of 193 nm.

Figures 50A, 50B, 50C:
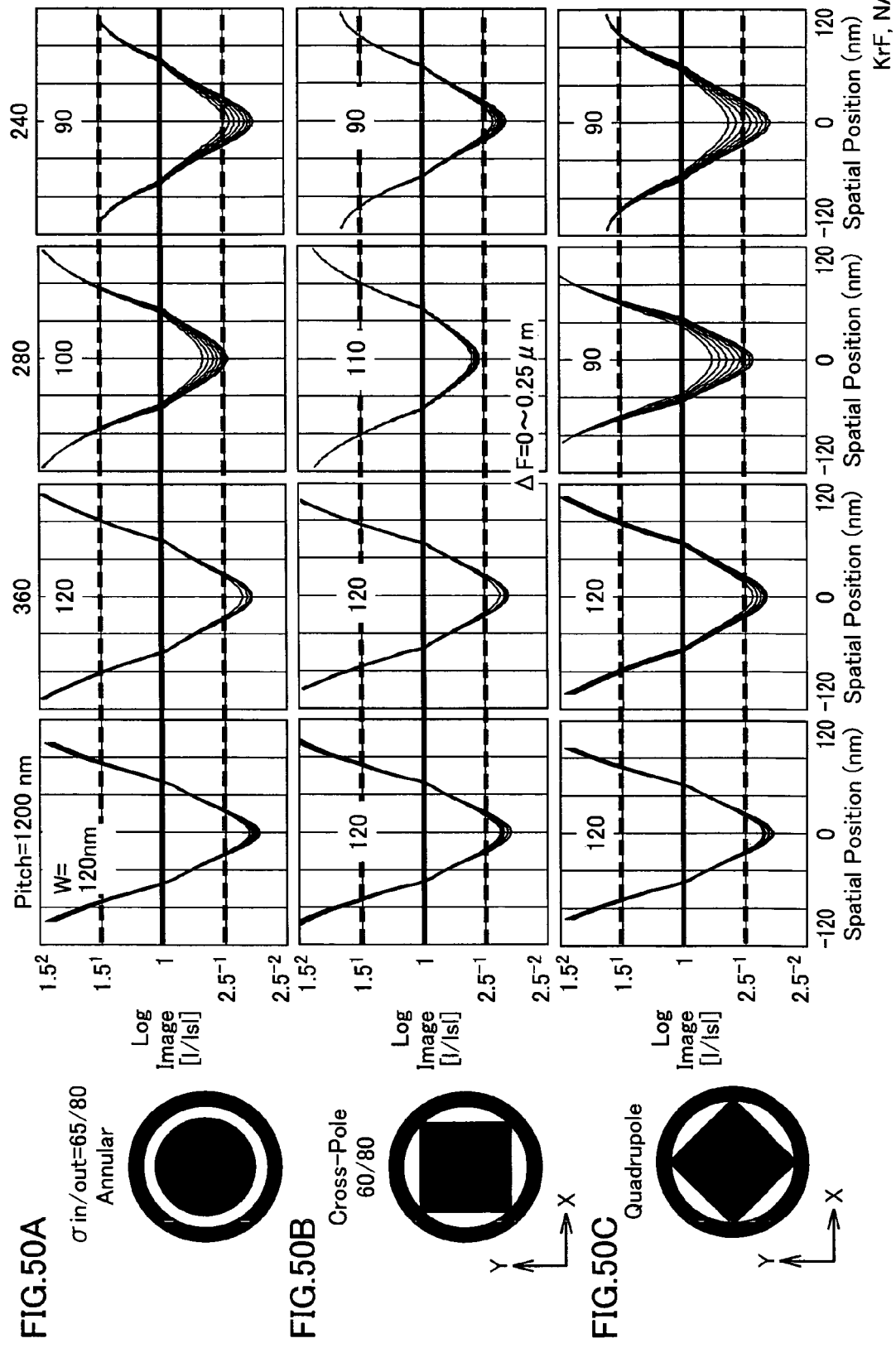
FIG. 50A includes a plan view showing the shape of a diaphragm of annular illumination to find optimization of illumination shape for square lattice arrangement and optical intensity distribution for various pattern shapes of the photo mask shown in FIG. 8, using focus as a parameter.
FIG. 50B includes a plan view showing the shape of a diaphragm of cross-pole illumination to find optimization of illumination shape for square lattice arrangement and optical intensity distribution for various pattern shapes of the photo mask shown in FIG. 8, using focus as a parameter.
FIG. 50C includes a plan view showing the shape of a diaphragm of quadrupole illumination to find optimization of illumination shape for square lattice arrangement and optical intensity distribution for various pattern shapes of the photo mask shown in FIG. 8, using focus as a parameter.

FIGS. 50A, 50B and 50C include plan views showing the shapes of diaphragms of (FIG. 50A) annular illumination, (FIG. 50B) cross-pole illumination and (FIG. 50C) quadrupole illumination to find optimization of illumination shape for square lattice arrangement, and variations of optical images formed by an image forming system with respect to dimension W (120 nm-90 nm) of opening pattern 22a, when pitch P of openings 22a of high-transmission half tone phase shift mask shown in FIG. 8 is changed. In each graph, focus is used as the parameter.

Referring to FIGS. 50A, 50B and 50C, for annular illumination, $\sigma_{in}/\sigma_{out}=65/80$, and for cross-pole illumination and quadrupole illumination, $\sigma_{in}/\sigma_{out}=60/80$. Further, for cross-pole illumination, the directions of the diagonal of illumination opening diaphragm (X and Y directions in the figure) are aligned with the directions of the longitudinal and lateral directions of virtual orthogonal lattice shown in FIG. 13. Further, for quadrupole illumination, the directions of the diagonal of illumination opening diaphragm (X and Y directions in the figure) are inclined by 45° from the directions of the longitudinal and lateral directions of virtual orthogonal lattice shown in FIG. 13.

As a result, it can be seen that, regardless of the arrangement pitch P of the openings of half-tone phase shift film 22, superior focusing characteristic with small variation with focus can be attained by cross-pole illumination, as compared with annular illumination or quadrupole illumination.

Specifically, by the high-transmittance half-tone phase shift mask 30 shown in FIG. 8, superior characteristic can be attained even when isolated pattern and dense pattern are mixed.

Figure 51:
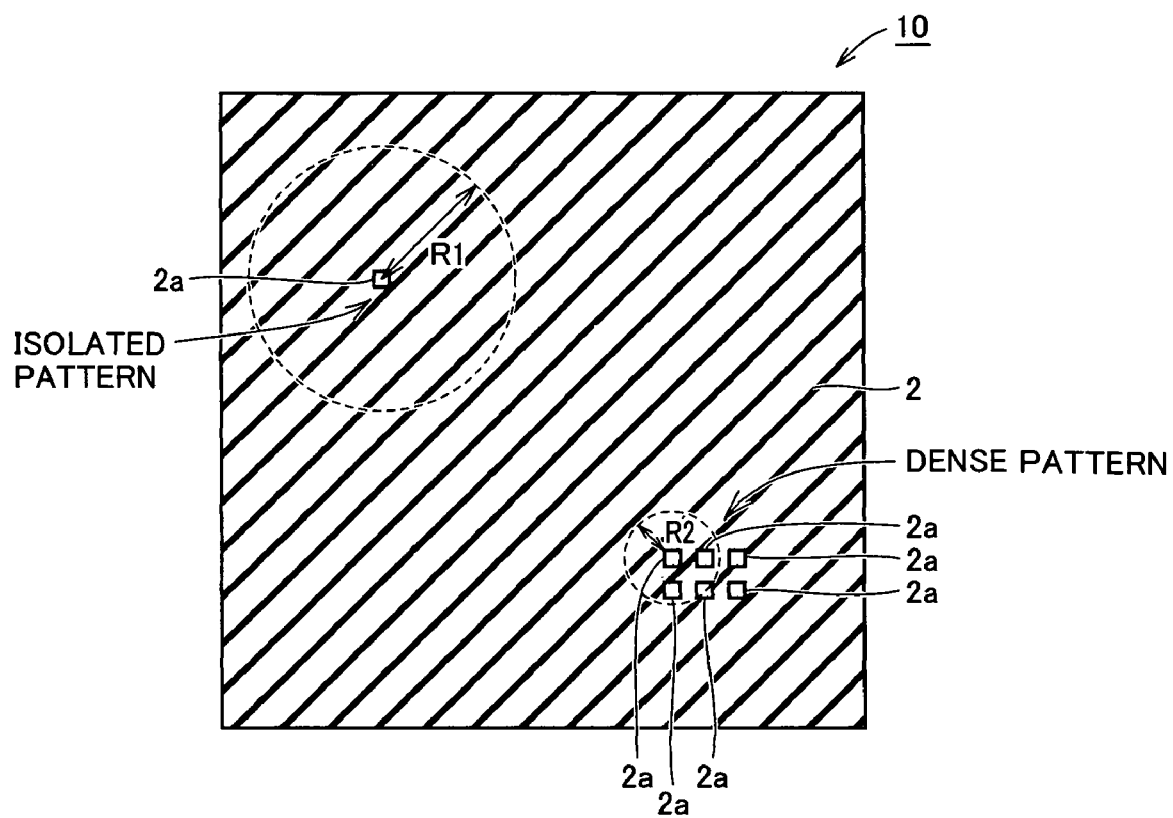
FIG. 51 is a schematic plan view showing isolated pattern and dense pattern mixed in a phase shift mask in accordance with an embodiment of the present invention.

Referring to FIG. 51, the meanings of "isolated pattern" and "dense pattern" will be described. Referring to FIG. 51, if there is no pattern within a distance corresponding to radius R1 of 3 from the center of a pattern 2a when measured with numerical aperture NA/wavelength λ being 1, the pattern is referred to as an isolated pattern. If there is another pattern 2a within a distance corresponding to radius R2 of 1 from the center of one pattern 2a when measured with numerical aperture NA/wavelength λ being 1, the pattern is referred to as dense pattern including a plurality of patterns.

Though a method of manufacturing a semiconductor device has been described by way of example of the pattern forming method, the present invention is similarly applicable to the method of manufacturing other electronic devices such as a liquid crystal display device, a thin film magnetic head and the like.

The present invention is particularly advantageous when applied to the step of forming a hole pattern in forming very fine, advanced semiconductor integrated circuits.

Further, the effect of the pattern forming method in accordance with the present invention is believed to be best utilized when applied mainly to manufacturing of logic integrated circuit among the advanced semiconductor integrated circuits.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A pattern forming method, comprising the steps of:
    forming a mask layer having a dense hole pattern with a plurality of holes positioned densely, on a film as an object of processing, by a first positive photo-resist;
    solidifying said mask layer of said first positive photo-resist;
    forming a second positive photo-resist on said mask layer of said first positive photo-resist to fill each of said plurality of holes of said dense hole pattern;
    projecting and exposing an image of dark points to said second positive photo-resist at some of positions corresponding to said holes of said dense hole pattern using a half-tone phase shift mask having a virtual lattice matching each of said holes of said dense hole pattern;
    developing said exposed second positive photo-resist to leave a pattern of dots formed at portions of said image of dark points of said second positive photo-resist in any of said plurality of holes of the pattern of said mask layer; and
    patterning said film as the object of processing, using said mask layer and said pattern of dots formed on said second positive photo-resist as a mask.

2. The pattern forming method according to claim 1, wherein
    said half-tone phase shift film has optical transmittance of at least 15% and at most 25%; and
    dimension of the opening of said half-tone phase shift film formed at said dot pattern portion is at least 0.26 and at most 0.45 with exposure light wavelength $\lambda$/numerical aperture NA being 1.

3. The pattern forming method according to claim 1, wherein
    exposure for forming said dense hole pattern on said first positive photo-resist is performed using a half-tone phase shift mask.

4. The pattern forming method according to claim 1, wherein
    exposure for forming said dense hole pattern on said first positive photo-resist is performed using modified illumination.

5. The pattern forming method according to claim 4, wherein said modified illumination is either cross-pole illumination or quadrupole illumination.

6. The pattern forming method according to claim 1, wherein exposure for forming said dense hole pattern on said first positive photo-resist is performed using a half-tone phase shift mask.

7. The pattern forming method according to claim 1, wherein
    exposure for forming said dense hole pattern on said first positive photo-resist is performed using modified illumination.

8. The pattern forming method according to claim 7, wherein said modified illumination is either cross-pole illumination or quadrupole illumination.

9. The pattern forming method according to claim 1, wherein exposure for forming said dot pattern on said second positive photo-resist is performed using modified illumination.

10. The pattern forming method according to claim 9, wherein said modified illumination is cross-pole illumination.

11. A method of manufacturing an electronic device, using the pattern forming method according to claim 1 for manufacturing the electronic device.

* * * * *